(12) United States Patent
Lee et al.

(10) Patent No.: US 9,171,819 B2
(45) Date of Patent: Oct. 27, 2015

(54) SEMICONDUCTOR PACKAGE

(71) Applicant: Samsung Electronics Co., Ltd., Suwon-si, Gyeonggi-do (KR)

(72) Inventors: Cheol-woo Lee, Anyang-si (KR); Ji-han Ko, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/511,158

(22) Filed: Oct. 9, 2014

(65) Prior Publication Data
US 2015/0102507 A1 Apr. 16, 2015

(30) Foreign Application Priority Data

Oct. 15, 2013 (KR) ........................ 10-2013-0122954

(51) Int. Cl.
*H01L 23/52* (2006.01)
*H01L 23/00* (2006.01)
(52) U.S. Cl.
CPC ................ *H01L 24/32* (2013.01); *H01L 24/48* (2013.01); *H01L 2224/3201* (2013.01); *H01L 2224/32145* (2013.01); *H01L 2924/06* (2013.01); *H01L 2924/35* (2013.01)
(58) Field of Classification Search
USPC ...................... 257/777, 783, E25.006, 25.013, 257/E25.021, E25.027, E23.085, E23.16, 257/E21.514, 753
See application file for complete search history.

(56) References Cited

U.S. PATENT DOCUMENTS

| | | | |
|---|---|---|---|
| 6,337,226 B1 | 1/2002 | Symons | |
| 6,353,263 B1 | 3/2002 | Dotta et al. | |
| 6,448,659 B1 | 9/2002 | Lee | |
| 7,521,810 B2* | 4/2009 | Kang et al. | 257/777 |
| 7,863,723 B2* | 1/2011 | Oh et al. | 257/686 |
| 7,960,023 B2 | 6/2011 | Sim et al. | |
| 8,084,856 B2 | 12/2011 | Hu | |
| 2002/0158316 A1* | 10/2002 | Lee et al. | 257/676 |
| 2003/0067083 A1* | 4/2003 | Jiang et al. | 257/777 |
| 2004/0245652 A1* | 12/2004 | Ogata | 257/777 |
| 2005/0253229 A1 | 11/2005 | Fukui et al. | |
| 2006/0249826 A1 | 11/2006 | Foong et al. | |
| 2007/0052089 A1 | 3/2007 | Kim et al. | |
| 2009/0051043 A1 | 2/2009 | Wong et al. | |
| 2009/0140440 A1 | 6/2009 | Liu et al. | |
| 2009/0311520 A1 | 12/2009 | Jin | |
| 2010/0027233 A1 | 2/2010 | Low et al. | |
| 2010/0117244 A1 | 5/2010 | Miyagawa et al. | |

(Continued)

FOREIGN PATENT DOCUMENTS

JP  2006066816 A  3/2006
JP  2007324483 A  12/2007

(Continued)

*Primary Examiner* — Jasmine Clark
(74) *Attorney, Agent, or Firm* — Renaissance IP Law Group LLP

(57) ABSTRACT

Provided is a semiconductor package that may prevent deformation of stacked semiconductor chips and minimize a semiconductor package size. The semiconductor package includes a package base substrate, a lower chip stacked on the package base substrate, an upper chip stacked on the lower chip, and a first die attach film (DAF) attached to a bottom surface of the upper chip to cover at least a portion of the lower chip. The first DAF may be a multi-layer film including a first attaching layer contacting the bottom surface of the upper chip and a second attaching layer attached to a bottom of the first attaching layer to cover at least a portion of a side surface of the lower chip.

14 Claims, 21 Drawing Sheets

(56) References Cited

U.S. PATENT DOCUMENTS

| | | |
|---|---|---|
| 2010/0193933 A1 | 8/2010 | Hasegawa et al. |
| 2010/0237490 A1 | 9/2010 | Chu et al. |
| 2010/0240196 A1* | 9/2010 | Saito et al. .............. 438/464 |
| 2011/0133324 A1* | 6/2011 | Fan et al. .............. 257/686 |
| 2011/0210455 A1 | 9/2011 | Oonishi et al. |
| 2011/0309526 A1 | 12/2011 | Cho et al. |
| 2012/0153432 A1 | 6/2012 | Karakane et al. |
| 2012/0248628 A1 | 10/2012 | Tanaka et al. |

FOREIGN PATENT DOCUMENTS

| | | |
|---|---|---|
| JP | 2012015351 | 1/2012 |
| JP | 2012191027 | 10/2012 |
| KR | 100877645 B1 | 1/2009 |
| KR | 20090127706 | 12/2009 |
| KR | 20110124064 A | 11/2011 |
| KR | 20120036691 A | 4/2012 |
| KR | 20120065892 A | 6/2012 |

* cited by examiner

SEMICONDUCTOR PACKAGE

CROSS-REFERENCE TO RELATED APPLICATIONS

This application claims the benefit of Korean Patent Application No. 10-2013-0122954, filed on Oct. 15, 2013, in the Korean Intellectual Property Office, the disclosure of which is incorporated herein in its entirety by reference.

BACKGROUND

The inventive concept relates to a semiconductor package, and more particularly, to a semiconductor package in which a plurality of semiconductor chips are stacked.

With the rapid development of electronic industry and the requirements of users, electronic devices become smaller in size, higher in capacity, and multifunctional. Therefore, semiconductor packages used in electronic devices need to become smaller in size, higher in capacity, and multifunctional. One approach for addressing these challenges is to provide a semiconductor package including a plurality of semiconductor chips. However, when a plurality of semiconductor chips are stacked and included in a semiconductor package, a semiconductor package size may need to increase. This can be due to various factors such as the upper semiconductor chip being thickened or a support member being used to prevent deformation of the stacked semiconductor chips.

SUMMARY

The inventive concept provides a semiconductor package that may prevent deformation of stacked semiconductor chips and minimize a semiconductor package size.

According to an aspect of the inventive concept, there is provided a semiconductor package including: a package base substrate, a lower chip stacked on the package base substrate, an upper chip stacked on the lower chip, and a first die attach film (DAF) attached to a bottom surface of the upper chip to cover at least a portion of the lower chip, wherein the first DAF is a multi-layer film including a first attaching layer contacting the bottom surface of the upper chip and a second attaching layer attached to a bottom of the first attaching layer to cover at least a portion of a side surface of the lower chip.

Each of the first attaching layer and the second attaching layer may include a binder component, and a weight-average molecular weight of the binder component of the first attaching layer may be larger than a weight-average molecular weight of the binder component of the second attaching layer.

The binder component of the first attaching layer may include a first binder material and a second binder material, the second binder material having a smaller weight-average molecular weight than the first binder material. The binder component of the second attaching layer may include the second binder material.

The semiconductor package may further include a second DAF attached to a bottom surface of the lower chip to attach the lower chip onto the package base substrate, wherein the second DAF may be a single film including a binder component having a larger weight-average molecular weight than the binder component of the second attaching layer.

The semiconductor package may further include a bonding wire connecting the package base substrate and a top surface of the lower chip, wherein the second attaching layer may cover at least a portion of the bonding wire.

The first attaching layer of the first DAF may contact a top surface of the lower chip.

The second attaching layer may include a protrusion portion protruding out of a range occupied by the upper chip, in a space between a level of the bottom surface of the upper chip and a level of a top surface of the package base substrate.

The protrusion portion of the second attaching layer may cover at least a portion of a top surface of the lower chip.

The protrusion portion of the second attaching layer may extend from one side surface of the lower chip through a top surface of the lower chip to the other side surface of the lower chip.

According to another aspect of the inventive concept, there is provided a semiconductor package including a package base substrate, first to fourth semiconductor chips stacked sequentially on the package base substrate with major axes thereof intersecting with each other, and first to fourth die attach films (DAFs) attached respectively to bottom surfaces of the first to fourth semiconductor chips, wherein each of the second, third, and fourth DAF comprises a first attaching layer contacting the bottom surface of the second, third, and fourth semiconductor chips, respectively, and a second attaching layer attached to a bottom of the first attaching layer to cover at least a portion of a side surface of the first, second, and third semiconductor chips, respectively.

The first DAF may include a binder resin. The first and second attaching layers of the second, third, and fourth DAF may each include a binder resin. A weight-average molecular weight of the binder resin of the first DAF is larger than a weight-average molecular weight of the binder resin of the second attaching layer of the second, third, and fourth DAF. A weight-average molecular weight of the binder resin of the first attaching layer of the second, third, and fourth DAF is larger than a weight-average molecular weight of the binder resin of the second attaching layer of the second, third, and fourth DAF.

The second attaching layer of the fourth DAF may cover at least a portion of a top surface of the third semiconductor chip that is adjacent to a boundary between the third semiconductor chip and the fourth semiconductor chip.

The second attaching layer of the fourth DAF may expose at least a portion of the top surface of the third semiconductor chip.

The second attaching layer of the second DAF may include a first protrusion portion protruding out of a range occupied by the second semiconductor chip, in a space between a level of the bottom surface of the second semiconductor chip and a level of a top surface of the package base substrate; the second attaching layer of the third DAF may include a second protrusion portion protruding out of a range occupied by the third semiconductor chip, in a space between a level of the bottom surface of the third semiconductor chip and a level of a top surface of the first semiconductor chip; and the second attaching layer of the fourth DAF may include a third protrusion portion protruding out of a range occupied by the fourth semiconductor chip, in a space between a level of the bottom surface of the fourth semiconductor chip and a level of a top surface of the second semiconductor chip.

A length of the first protrusion portion protruding in a direction of the major axis of the first semiconductor chip may be smaller than a length of the third protrusion portion protruding in a direction of the major axis of the third semiconductor chip.

Embodiments of the inventive concept may also include a method for providing a semiconductor package. The method may include sequentially stacking first to fourth semiconductor chips on a package base substrate with major axes thereof intersecting with each other, attaching first to fourth die attach films (DAFs) respectively to bottom surfaces of the first to fourth semiconductor chips, contacting a first attaching layer of each of the second, third, and fourth DAF to the bottom surface of the second, third, and fourth semiconductor chips, respectively, attaching a second attaching layer to a bottom of the first attaching layer, and covering, by the second attaching layer, at least a portion of a side surface of the first, second, and third semiconductor chips.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
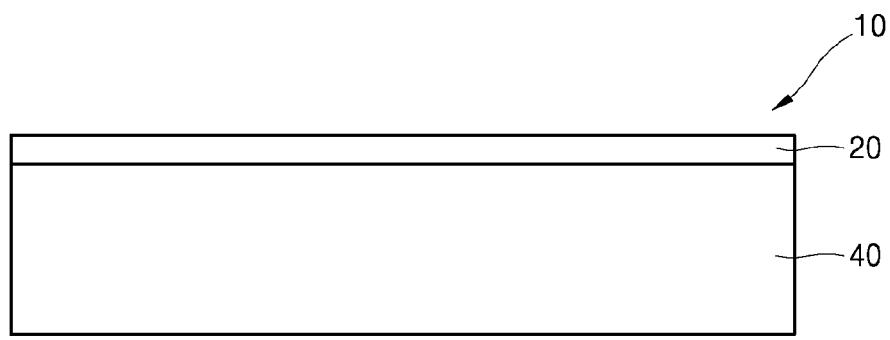
FIG. 1 is a cross-sectional view illustrating an aspect of a die attach film (DAF) used in a semiconductor package according to an embodiment of the inventive concept.

As used herein, the term "and/or" includes any and all combinations of one or more of the associated listed items. Expressions such as "at least one of," when preceding a list of elements, modify the entire list of elements and do not modify the individual elements of the list.

Hereinafter, exemplary embodiments of the inventive concept will be described in detail with reference to the accompanying drawings. The inventive concept, however, may be embodied in many different forms and should not be construed as being limited to the embodiments set forth herein; rather, these embodiments are provided so that this disclosure will be thorough and complete, and will fully convey the inventive concept to those of ordinary skill in the art. In the drawings, the sizes of elements may be exaggerated for clarity.

It will be understood that when an element is referred to as being "on" another element, it may be directly on the other element or intervening elements may be present. In contrast, when an element is referred to as being "directly on" another element, there are no intervening elements present. Other terms, such as "between," describing a relation between elements may also be interpreted in the same way.

Although terms such as "first" and "second" may be used herein to describe various elements or components, these elements or components should not be limited by these terms. These terms are only used to distinguish one element or component from another element or component. For example, a first element may be termed a second element, and, similarly, a second element may be termed a first element, without departing from the scope of the inventive concept.

As used herein, the singular forms "a," "an," and "the" are intended to include the plural forms as well, unless the context clearly indicates otherwise. It will be understood that terms such as "comprise," "include," and "have," when used herein, specify the presence of stated features, integers, steps, operations, elements, components, or combinations thereof, but do not preclude the presence or addition of one or more other features, integers, steps, operations, elements, components, or combinations thereof.

Unless otherwise defined, all terms used herein may have the same meaning as commonly understood by those of ordinary skill in the art.

Unless specifically indicated herein, a vertical direction or a horizontal direction refers to a vertical direction or a horizontal direction with respect to a main surface of a package base substrate. Also, unless specifically indicated herein, a top surface of an element stacked on the package base substrate refers to an opposite surface with respect to the package base substrate, and a bottom surface thereof refers to a surface facing the package base substrate.

Hereinafter, exemplary embodiments of the inventive concept will be described in detail with reference to the accompanying drawings.

FIG. 1 is a cross-sectional view illustrating an aspect of a die attach film (DAF) 10 used in a semiconductor package according to an embodiment of the inventive concept.

Referring to FIG. 1, the DAF 10 is a multiple layer film including a first attaching layer 20 and a second attaching layer 40. The first attaching layer 20 and the second attaching layer 40 may be formed in a B-stage state. The B-stage state refers herein to a state in which a solvent is removed in an A-stage state that is an initial reaction stage of a thermosetting resin when curing is not in progress. The resin is not melted or dissolved, but rather it swells in the solvent. In general, the A-stage state changes into the B-stage state through a heat treatment. The B-stage state may have an adhesive property. For reference, a C-stage state refers to a state in which curing is completed.

The first attaching layer 20 and the second attaching layer 40 may each include a binder component and a curing component. A weight-average molecular weight of the binder component of the first attaching layer 20 may be larger than a weight-average molecular weight of the binder component of the second attaching layer 40. The weight-average molecular weight of the binder component of the first attaching layer 20 may be, for example, about 100,000 to about 2,000,000. The weight-average molecular weight of the binder component of the second attaching layer 40 may be, for example, about 100 to about 5,000. The weight-average molecular weight of the binder component of the first attaching layer 20 may be larger by about 20 times to about 1,000 times the weight-average molecular weight of the binder component of the second attaching layer 40.

The binder component of the first attaching layer 20 may include a first binder material and a second binder material. The second binder material may have a smaller weight-average molecular weight than the first binder material. The binder component of the second attaching layer 40 may include a material that is identical to or similar to the second binder material. That is, the binder component of the second attaching layer 40 may include the second binder material having a relatively small weight-average molecular weight. The binder component of the first attaching layer 20 may include a mixture of the second binder material having a relatively small weight-average molecular weight and the first binder material having a relatively large weight-average molecular weight.

The first binder material may be, for example, an acryl-based polymer resin. The second binder material may be, for example, an epoxy resin. The binder component of the first attaching layer 20 may include, for example, a mixture of an acryl-based polymer resin and an epoxy resin. The binder component of the second attaching layer 40 may include, for example, an epoxy resin.

The curing component of each of the first attaching layer 20 and the second attaching layer 40 may include, for example, an epoxy resin, a phenol-based curing resin, or a phenoxy resin. The curing component of the first attaching layer 20 and the second attaching layer 40 may also function as the binder component. For example, the first attaching layer 20 may include a mixture of an acryl-based polymer resin and an epoxy resin, and the epoxy resin may function as the curing component with respect to the acryl-based polymer resin. The second attaching layer 40 may include an epoxy resin, and the epoxy resin may function as both the binder component and the curing component.

The first attaching layer 20 and the second attaching layer 40 may further include a filler and an additive such as a curing catalyst or a silane coupling agent. The curing catalyst may be, for example, a phosphine-based, imidazole-based, or amine-based curing catalyst. The silane coupling agent may be, for example, a mercapto silane coupling agent or an epoxy silane coupling agent. The filler may be, for example, silica.

The second attaching layer 40 may have higher fluidity and lower viscosity than the first attaching layer 20. Also, since the second attaching layer 40 includes a material having a lower weight-average molecular weight than the material of the first attaching layer 20, the second attaching layer 40 may be easily deformed even by small pressure.

The first attaching layer 20 may have a smaller thickness than the second attaching layer 40. For example, the first attaching layer 20 may have a thickness of about 1 μm to about 20 μm, and the second attaching layer 40 may have a thickness of about 30 μm to about 100 μm. The first attaching layer 20 may be formed to have such a small thickness as to fix to the second attaching layer 40 that has relatively high fluidity and viscosity. The thickness of the second attaching layer 40 may be similar to or greater than the thickness of a semiconductor chip that is used to form a semiconductor package. For example, when the first attaching layer 20 has a thickness of about 5 μm and the semiconductor chip has a thickness of about 40 μm, the second attaching layer 40 may have a thickness of about 45 μm or more.

Figure 2:
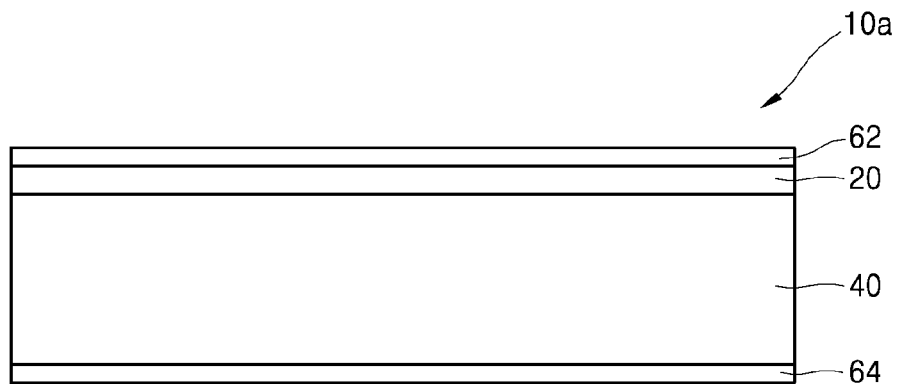
FIG. 2 is a cross-sectional view illustrating another aspect of a DAF used in a semiconductor package according to an embodiment of the inventive concept.

FIG. 2 is a cross-sectional view illustrating another aspect of a DAF 10a used in a semiconductor package according to an embodiment of the inventive concept.

Referring to FIG. 2, the DAF 10a is a multi-layer film including a first attaching layer 20 and a second attaching layer 40. The DAF 10a may further include a first heterogeneous film 62 covering a top surface of the first attaching layer 20 and a second heterogeneous film 64 covering a bottom surface of the second attaching layer 40. As described with reference to FIG. 1, the first attaching layer 20 and the second attaching layer 40 may have an adhesive property, and the second attaching layer 40 may have relatively high fluidity and relatively low viscosity. Therefore, the top surface of the first attaching layer 20 and the bottom surface of the second attaching layer 40 may be covered and protected by the first heterogeneous film 62 and the second heterogeneous film 64, respectively, before actual use. The first heterogeneous film 62 and the second heterogeneous film 64 may be removed from the DAF 10a when the DAF 10a is attached to a semiconductor chip to form a semiconductor package. For example, the first heterogeneous film 62 is first removed and the top surface of the first attaching layer 20 is attached to the semiconductor chip, and then the second heterogeneous film 64 is removed and the semiconductor chip is attached onto another semiconductor chip or a package base substrate such as a printed circuit board.

The first heterogeneous film 62 and the second heterogeneous film 64 may be formed, for example, by coating a polyethylene-based film or a polyolefin-based film, such as polyethylene terephthalate (PET) or polyethylene-2,6-naphthalenedicarboxylate (PEN), with silicone or Teflon.

FIGS. 3 to 19 are plan views and cross-sectional views illustrating an aspect of a semiconductor package and a method of manufacturing the same according to an embodiment of the inventive concept.

Figure 3:
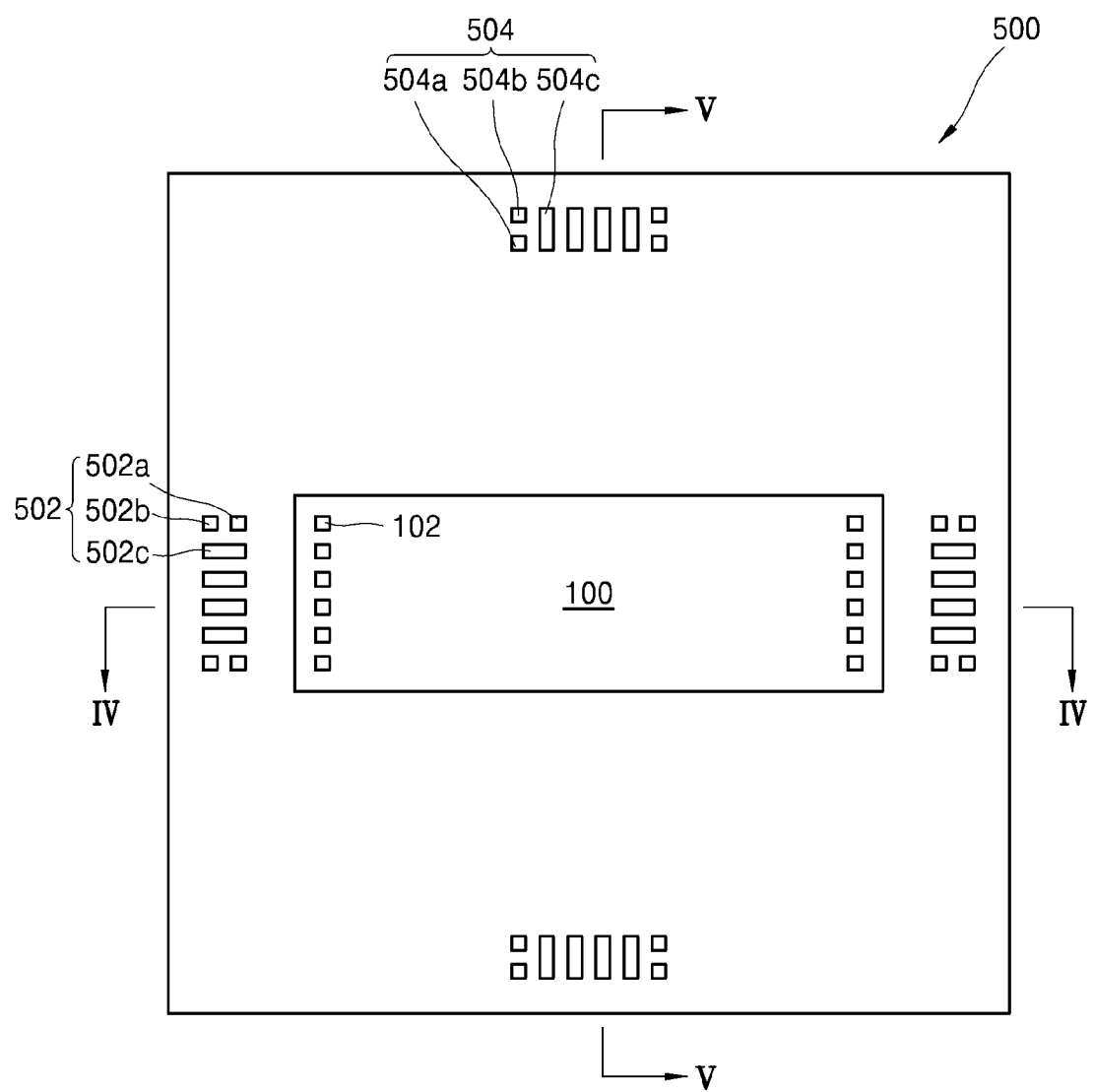
FIG. 3 is a plan view illustrating a stage in which a first semiconductor chip is attached onto a package base substrate according to an embodiment of the inventive concept.

FIG. 3 is a plan view illustrating a stage in which a first semiconductor chip is attached onto a package base substrate according to an embodiment of the inventive concept.

Figure 4:
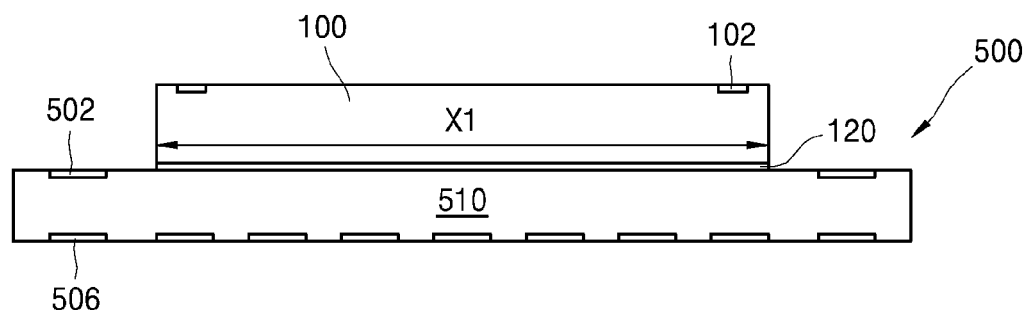
FIGS. 4 and 5 are cross-sectional views illustrating a stage in which a first semiconductor chip is attached onto a package base substrate according to an embodiment of the inventive concept.
Figure 5:
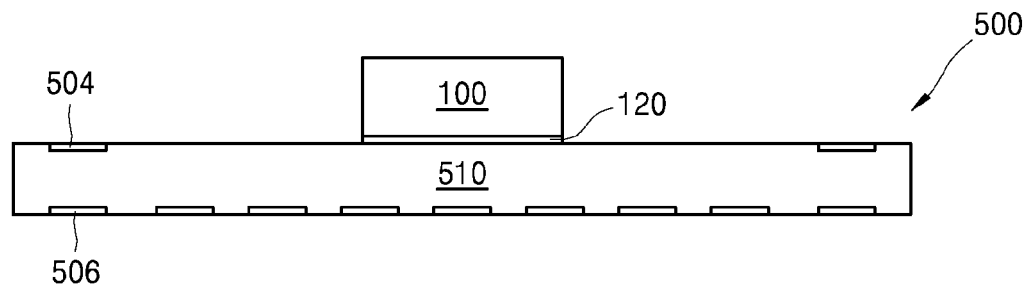

FIGS. 4 and 5 are cross-sectional views illustrating a stage in which a first semiconductor chip is attached onto a package base substrate according to an embodiment of the inventive concept. More specifically, FIG. 4 is a cross-sectional view taken along a line IV-IV of FIG. 3, and FIG. 5 is a cross-sectional view taken along a line V-V of FIG. 3.

Referring to FIGS. 3 to 5, a first semiconductor chip 100 is attached onto a package base substrate 500. The first semiconductor chip 100 may be attached onto the package base substrate 500 such that an inactive surface faces the package base substrate 500. The first semiconductor chip 100 may be attached onto the package base substrate 500 after a first DAF 120 is attached to the inactive surface.

A semiconductor device may be formed on an active surface of the first semiconductor chip 100. That is, the semiconductor device may be formed on a surface opposite to the inactive surface facing the package base substrate 500. For example, the first semiconductor chip 100 may include silicon (Si). By way of another example, the first semiconductor chip 100 may include a semiconductor element such as germanium (Ge), or a compound semiconductor such as silicon carbide (SiC), gallium arsenide (GaAs), indium arsenide (InAs), and/or indium phosphide (InP). By way of yet another example, the first semiconductor chip 100 may have a silicon-on-insulator (SOI) structure. For example, the first semiconductor chip 100 may include a buried oxide (BOX) layer. The first semiconductor chip 100 may include a conductive region, for example, a doped well or a doped structure. Also, the first semiconductor chip 100 may have various device isolation structures such as a shallow trench isolation (STI) structure.

The semiconductor device formed on the first semiconductor chip 100 may include a large scale integration (LSI) system, a flash memory, a DRAM, an SRAM, an EEPROM, a PRAM, an MRAM, an RRAM, or the like. Specifically, the semiconductor device formed on the first semiconductor chip 100 may include various types of individual devices. The individual devices may include various microelectronic devices. For example, a metal-oxide-semiconductor field effect transistor (MOSFET) such as a complementary metal-oxide-semiconductor transistor (CMOS transistor), an LSI system, an image sensor such as a CMOS imaging sensor (CIS), active devices, and passive devices, may be included in the individual devices. Each of the individual devices may be electrically connected to the conductive region of the first semiconductor chip 100. The semiconductor device formed on the first semiconductor chip 100 may further include a conductive wire or a conductive plug that electrically connects at least one or two of the individual devices to the conductive region of the first semiconductor chip 100. Also, the individual devices may be electrically isolated from the adjacent other individual devices by insulating layers.

The semiconductor device formed on the first semiconductor chip 100 may be formed to include a plurality of wire structures for connecting the individual devices to other wires formed in the first semiconductor chip 100. The wire structures may include a metal wire layer and a via plug. The metal wire layer and the via plug may include a wire barrier layer and a wire metal layer. The wire barrier layer may include at least one of Ti, TiN, Ta, and TaN. The wire metal layer may include at least one of W, Al, and Cu. The metal wire layer and the via plug may include the same material. By way of another example, at least a portion of the metal wire layer and the via plug may include different materials. A plurality of metal wire layers and/or a plurality of via plugs may constitute a multi-layer structure. That is, the wire structure may be a multi-layer structure in which two or more metal wire layers and two or more via plugs are alternately stacked.

The first semiconductor chip 100 may include a first bonding pad 102 that is electrically connected to the semiconductor device. For example, the first bonding pad 102 may be a portion of one of the metal wire layers constituting a multi-layer structure.

The package base substrate 500 may be a printed circuit board, but is not limited thereto. For example, the package base substrate 500 may be a printed circuit board or a lead frame. When the package base substrate 500 is a printed circuit board, the package base substrate 500 may include top pads 502 and 504 and a bottom pad 506, which are exposed through a solder resist layer (not illustrated), on the top and bottom surfaces, respectively, of a base substrate 510. When the package base substrate 500 is a lead frame, the package base substrate 500 may include a plurality of leads.

The base substrate 510 may include at least one of a phenol resin, an epoxy resin, and a polyimide resin. For example, the base substrate 510 may include at least one of FR4, tetrafunctional epoxy, polyphenylene ether, epoxy/polyphenylene oxide, bismaleimidetriazine, thermount, cyanate ester, polyimide, and liquid crystal polymer. The top pads 502 and 504 and the bottom pad 506 may include copper, nickel, stainless steel, or beryllium copper. An internal wire (not illustrated) that electrically connects the top pads 502 and 504 and the bottom pad 506 may be formed in the base substrate 510.

The top pads 502 and 504 and the bottom pad 506 may be exposed through the solder resist layer. A circuit wire that is patterned after the base substrate 510 may be coated with copper (Cu) foil.

The top pads 502 and 504 may include a first top pad 502 and a second top pad 504. The first top pad 502 may include isolation pads 502a and 502b and a common pad 502c. The second top pad 504 may include isolation pads 504a and 504b and a common pad 504c. Each of the isolation pads 502a, 502b, 504a and 504b may be connected to one semiconductor chip through a bonding wire. The common pads 502c and 504c may be connected to a plurality of semiconductor chips through a bonding wire.

The first top pad 502 and the second top pad 504 may include only the isolation pads 502a, 502b, 504a and 504b, or may include only the common pads 502c and 504c. The isolation pads 502a, 502b, 504a and 504b and the common pads 502c and 504c may be selectively used according to the functions and operations of a plurality of semiconductor chips included in a semiconductor package.

FIG. 3 illustrates that two isolation pads 502a and 502b are associated with one common pad 502c, and isolation pads 504a and 504b are associated with one common pad 504c. However, embodiments of the inventive concept are not limited thereto. For example, when one common pad (e.g., 502c or 504c) is connected to three or more semiconductor chips, three or more isolation pads may be associated with the one common pad.

The first semiconductor chip 100 may have a top surface and a bottom surface that have a rectangular shape having a major axis X1 and a minor axis. The first semiconductor chip 100 may be attached onto the package base substrate 500 such that the major axis X1 faces in a first direction (e.g., a horizontal direction as shown in FIGS. 3 and 4). The first top pad 502 may be disposed on the package base substrate 500 such that the first top pad 502 is adjacent to both ends of the first semiconductor chip 100 in the direction of the major axis X1. By way of another example, the first top pad 502 may be disposed on the package base substrate 500 such that the first top pad 502 is adjacent to one end of the first semiconductor chip 100 in the direction of the major axis X1.

The first DAF 120 may be a single film including a single layer. The first DAF 120 may include a material that is identical to or similar to the material of the first attaching layer 20 illustrated in FIG. 1 or 2. The first DAF 120 may include a binder component that has a larger weight-average molecular weight than the binder component of the second attaching layer 40 illustrated in FIG. 1 or 2.

Figure 6:
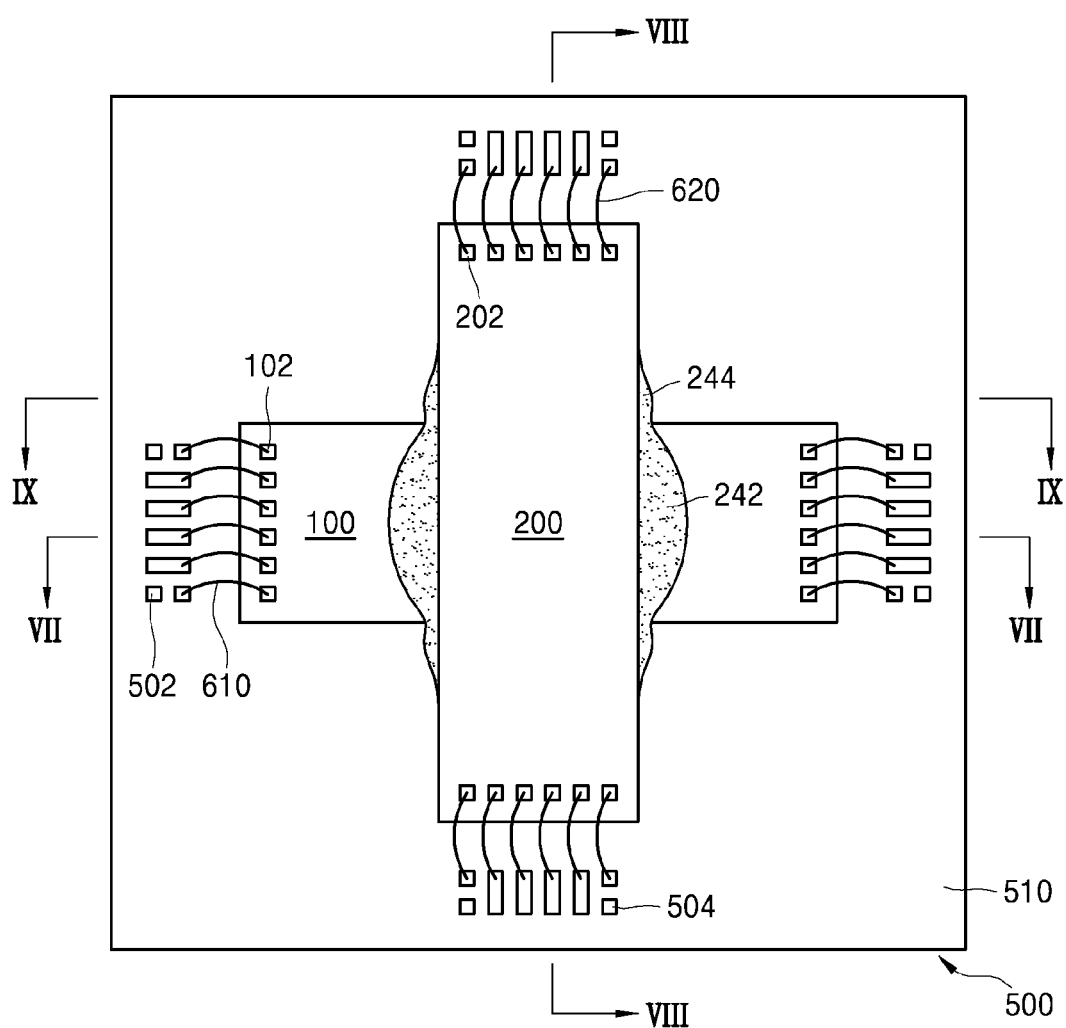
FIG. 6 is a plan view illustrating a stage in which a second semiconductor chip is attached onto a first semiconductor chip according to an embodiment of the inventive concept.

FIG. 6 is a plan view illustrating a stage in which a second semiconductor chip is attached onto a first semiconductor chip according to an embodiment of the inventive concept.

Figure 7:
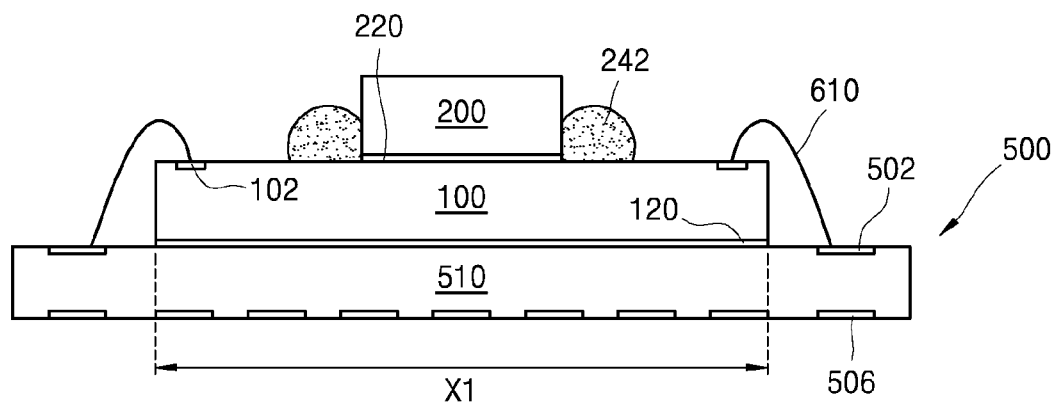
FIGS. 7 to 9 are cross-sectional views illustrating a stage in which a second semiconductor chip is attached onto a first semiconductor chip according to an embodiment of the inventive concept.
Figure 8:
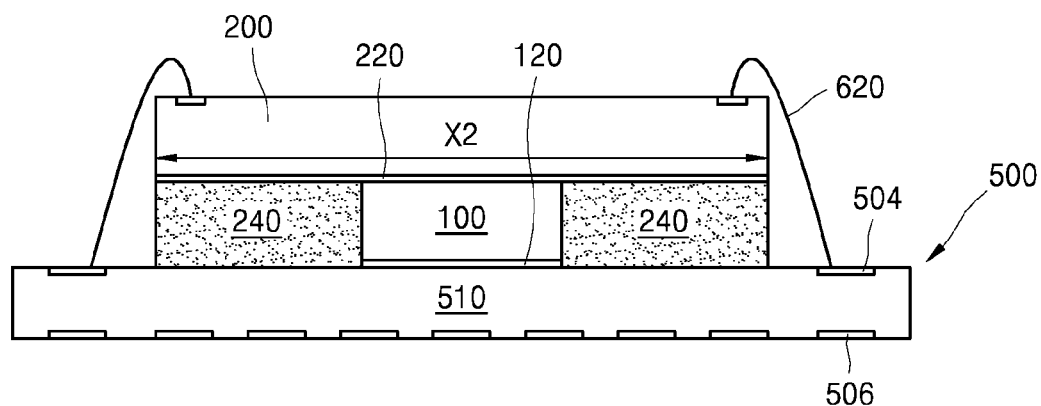
Figure 9:
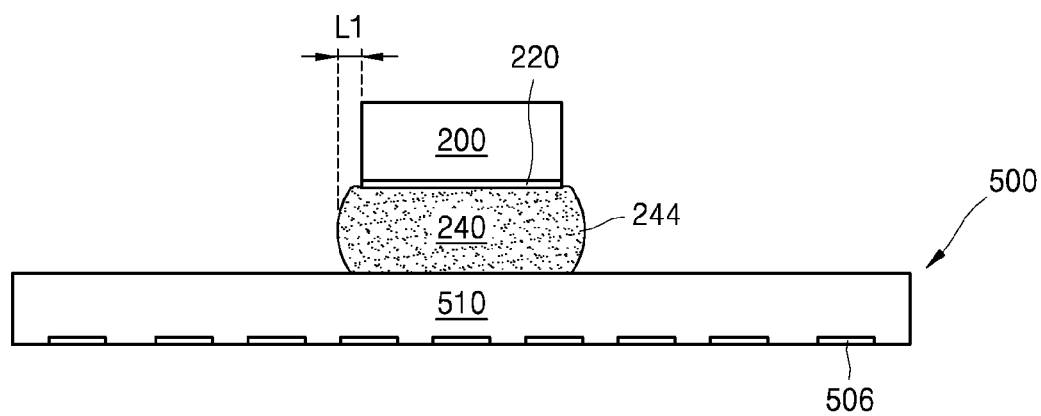

FIGS. 7 to 9 are cross-sectional views illustrating a stage in which a second semiconductor chip is attached onto a first semiconductor chip according to an embodiment of the inventive concept. Specifically, FIG. 7 is a cross-sectional view taken along a line VII-VII of FIG. 6, FIG. 8 is a cross-sectional view taken along a line VIII-VIII of FIG. 6, and FIG. 9 is a cross-sectional view taken along a line IX-IX of FIG. 6.

Referring to FIGS. 6 to 9, a second semiconductor chip 200 is attached onto the first semiconductor chip 100, which is attached onto the package base substrate 500. The second semiconductor chip 200 may be attached onto the first semiconductor chip 100 such that an inactive surface faces the package base substrate 500, that is, the first semiconductor chip 100. The second semiconductor chip 200 may be attached onto the first semiconductor chip 100 after second DAFs 220 and 240 are attached to the inactive surface.

A semiconductor device may be formed on an active surface of the second semiconductor chip 200. That is, a semiconductor device may be formed on a surface opposite to the inactive surface facing the package base substrate 500. The second semiconductor chip 200 and the semiconductor device formed on the second semiconductor chip 200 may be identical to or similar to the first semiconductor chip 100 and the semiconductor device formed on the first semiconductor chip 100, respectively, which have been described with reference to FIGS. 3 to 5, and thus a detailed description thereof is not repeated.

The second DAFs 220 and 240 include a first attaching layer 220 and a second attaching layer 240. Before the second semiconductor chip 200 is attached onto the first semiconductor chip 100, the first attaching layer 220 and the second attaching layer 240 of the second DAFs 220 and 240 may be identical to the first attaching layer 20 and the second attaching layer 40 of the DAF 10 illustrated in FIG. 1. That is, the second DAFs 220 and 240 may be similar to or otherwise correspond to the attachment of the DAF 10 of FIG. 1 to the second semiconductor chip 200. Thus, a detailed description of the first attaching layer 220 and the second attaching layer 240 of the second DAFs 220 and 240 is not repeated.

The second semiconductor chip 200 may be attached onto the first semiconductor chip 100 such that a major axis X2 intersects with the major axis X1 of the first semiconductor chip 100. The second semiconductor chip 200 may be attached onto the first semiconductor chip 100 such that the major axis X2 faces in a second direction (a vertical direction in FIG. 6 and a horizontal direction in FIG. 8). For example, the major axis X1 of the first semiconductor chip 100 and the major axis X2 of the second semiconductor chip 200 may be substantially perpendicular to each other. The second top pad 504 may be disposed on the package base substrate 500 such that the second top pad 504 is adjacent to both ends of the second semiconductor chip 200 in the direction of the major axis X2. By way of another example, the second top pad 504 may be disposed on the package base substrate 500 such that the second top pad 504 is adjacent to one end of the second semiconductor chip 200 in the direction of the major axis X2.

In the drawings, for the convenience of denotation, the major axis X1 of the first semiconductor chip 100 and the major axis X2 of the second semiconductor chip 200 may be illustrated as parallel axes facing in the same direction.

When the second semiconductor chip 200 is attached onto the first semiconductor chip 100, pressure may be applied to the second semiconductor chip 200. Since the second attaching layer 240 of the second DAFs 220 and 240 has a relatively small weight-average molecular weight, portions of the second attaching layer 240 of the second DAFs 220 and 240 located at an intersection between the first semiconductor chip 100 and the second semiconductor chip 200 may be easily pushed from the bottom of the second semiconductor chip 200 to the periphery thereof. The thickness of the second attaching layer 240 of the second DAFs 220 and 240 may be set to be equal to or greater than the thickness of the first semiconductor chip 100 and the first DAF 120, such that the second attaching layer 240 of the second DAFs 220 and 240 may contact the package base substrate 500. Between the second semiconductor chip 200 and the package base substrate 500, the second DAFs 220 and 240 may fill a space except a portion occupied by the first semiconductor chip 100 and the first DAF 120.

The first semiconductor chip 100 and the first attaching layer 220 of the second DAFs 220 and 240 may contact each other. As will be described later, a portion of the second attaching layer 240 of the second DAFs 220 and 240 may be left between the first semiconductor chip 100 and the first attaching layer 220 of the second DAFs 220 and 240.

The second attaching layer 240 of the second DAFs 220 and 240 may cover a side surface of the first semiconductor chip 100 disposed under the second semiconductor chip 200. With respect to the second attaching layer 240 of the second DAFs 220 and 240, the portions pushed from the bottom of the second semiconductor chip 200 to the periphery thereof may be referred to as protrusion portions 242 and 244 of the second DAFs 220 and 240. The protrusion portions 242 and 244 of the second DAFs 220 and 240 may be collectively referred to as a first protrusion portion 242/244. That is, the second attaching layer 240 of the second DAFs 220 and 240 may have protrusion portions 242 and 244 that protrude from a range occupied by the second semiconductor chip 200 among the space between a level of the bottom surface of the second semiconductor chip 200 and a level of the top surface of the package base substrate 500. The range occupied by the second semiconductor chip 200 among the space between the level of the bottom surface of the second semiconductor chip 200 and the level of the top surface of the package base substrate 500 refers to a space that is defined under the second semiconductor chip 200 by the top surface of the package base substrate 500 and a virtual surface extending vertically from an edge of the second semiconductor chip 200.

The protrusion portions 242 and 244 of the second DAFs 220 and 240 may include a first protrusion portion 242 contacting the top surface of the first semiconductor chip 100 on the top surface of the first semiconductor chip 100 and a second protrusion portion 244 contacting both side surfaces of the first semiconductor chip 100. The first protrusion portion 242 of the second DAFs 220 and 240 may contact a portion of the side surface of the second semiconductor chip 200. The first protrusion portion 242 of the second DAFs 220 and 240 may cover a portion of the top surface of the first semiconductor chip 100 that is adjacent to a boundary between the first semiconductor chip 100 and the second semiconductor chip 200. The second protrusion portion 244 of the second DAFs 220 and 240 refers to a portion that extends and protrudes in the direction of the major axis X1 of the first semiconductor chip 100 from the second attaching layer 240 of the second DAFs 220 and 240 disposed within the range occupied by the second semiconductor chip 200 among the space between the level of the bottom surface of the second semiconductor chip 200 and the level of the top surface of the package base substrate 500. The protrusion portions 242 and 244 of the second DAFs 220 and 240 may extend from one side surface of the first semiconductor chip 100 through the top surface of the first semiconductor chip 100 onto the other side surface of the first semiconductor chip 100. The second protrusion portion 244 of the second DAFs 220 and 240 may extend by a first length L1 in the direction of the major axis X1 of the first semiconductor chip 100.

A bonding wire 610 or other suitable conductor may be formed to connect the first semiconductor chip 100 and the package base substrate 500. A bonding wire 620 or other suitable conductor may be formed to connect the second semiconductor chip 200 and the package base substrate 500. The bonding wires 610 and 620 may be formed of a metal material such as gold, silver, platinum, aluminum, or copper. The bonding wires 610 and 620 may be formed of a single metal or alloy. By way of another example, the bonding wires 610 and 620 may formed by coating a core, which is formed of a single metal or alloy, with another metal or alloy.

The first bonding wire 610 connecting the first semiconductor chip 100 and the package base substrate 500 may be formed before or after the second semiconductor chip 200 is attached onto the first semiconductor chip 100. The second bonding wire 620 connecting the second semiconductor chip 200 and the package base substrate 500 may be formed after the second semiconductor chip 200 is attached onto the first semiconductor chip 100.

Figure 14:
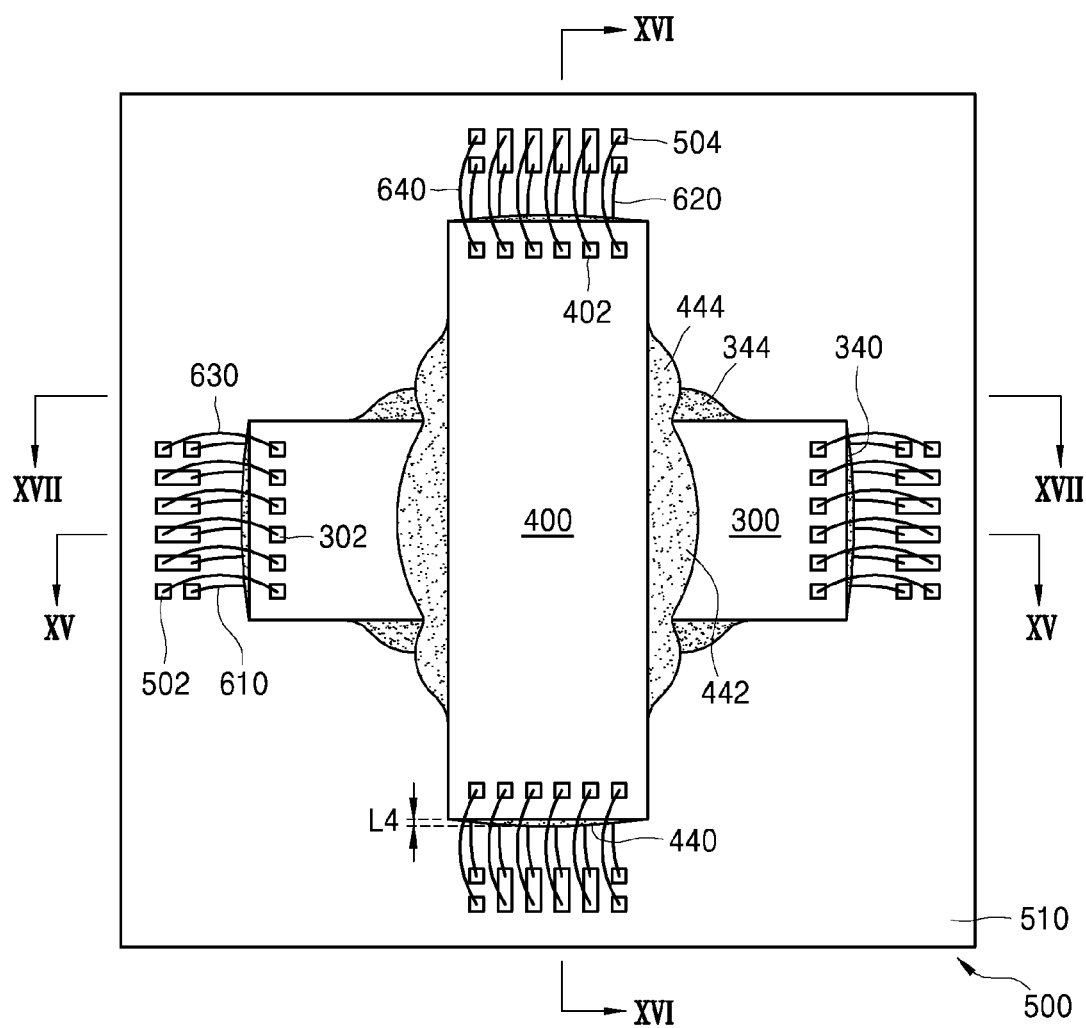
FIG. 14 is a plan view illustrating a stage in which a fourth semiconductor chip is attached onto a third semiconductor chip according to an embodiment of the inventive concept.

The first bonding wire 610 may connect the first bonding pad 102 of the first semiconductor chip 100 and the first top pad 502 of the package base substrate 500 to electrically connect the first semiconductor chip 100 and the package base substrate 500. When the first top pad 502 includes the isolation pads 502a and 502b, the first bonding wire 610 may connect the first isolation pad 502a of the first top pad 502 and the first bonding pad 102. The second isolation pad 502b of the first top pad 502 may be connected through a bonding pad of a semiconductor chip different from the first semiconductor chip 100, for example, through a third bonding pad 302 of a third semiconductor chip 300 as illustrated in FIG. 14—e.g., a third bonding wire 630, as further described below. By way of another example, when the first top pad 502 includes the common pad 502c, the first bonding wire 610 may connect the common pad 502c of the first top pad 502 and the first bonding pad 102.

The second bonding wire 620 may connect the second bonding pad 202 of the second semiconductor chip 200 and the second top pad 504 of the package base substrate 500 to electrically connect the second semiconductor chip 200 and the package base substrate 500. When the second top pad 504 includes the isolation pads 504a and 504b, the second bonding wire 620 may connect the first isolation pad 504a of the second top pad 504 and the second bonding pad 202. The second isolation pad 504b of the second top pad 504 may be connected through a bonding pad of a semiconductor chip different from the second semiconductor chip 200, for example, through a fourth bonding pad 402 of a fourth semiconductor chip 400 as illustrated in FIG. 14—e.g., a fourth bonding wire 640, as further described below. By way of another example, when the second top pad 504 includes the common pad 504c, the second bonding wire 620 may connect the common pad 504c of the second top pad 504 and the second bonding pad 202.

When the second bonding wire 620 is connected to the second bonding pad 202 (e.g., in a wire bonding process), pressure may be applied to the second semiconductor chip 200. However, since the second attaching layer 240 of the second DAFs 220 and 240 fills a space under the second semiconductor chip 200, the second semiconductor chip 200 does not warp in the wire bonding process for connecting the second bonding wire 620 to the second bonding pad 202. Therefore, the second semiconductor chip 200 may be formed to be relatively thin.

Figure 10:
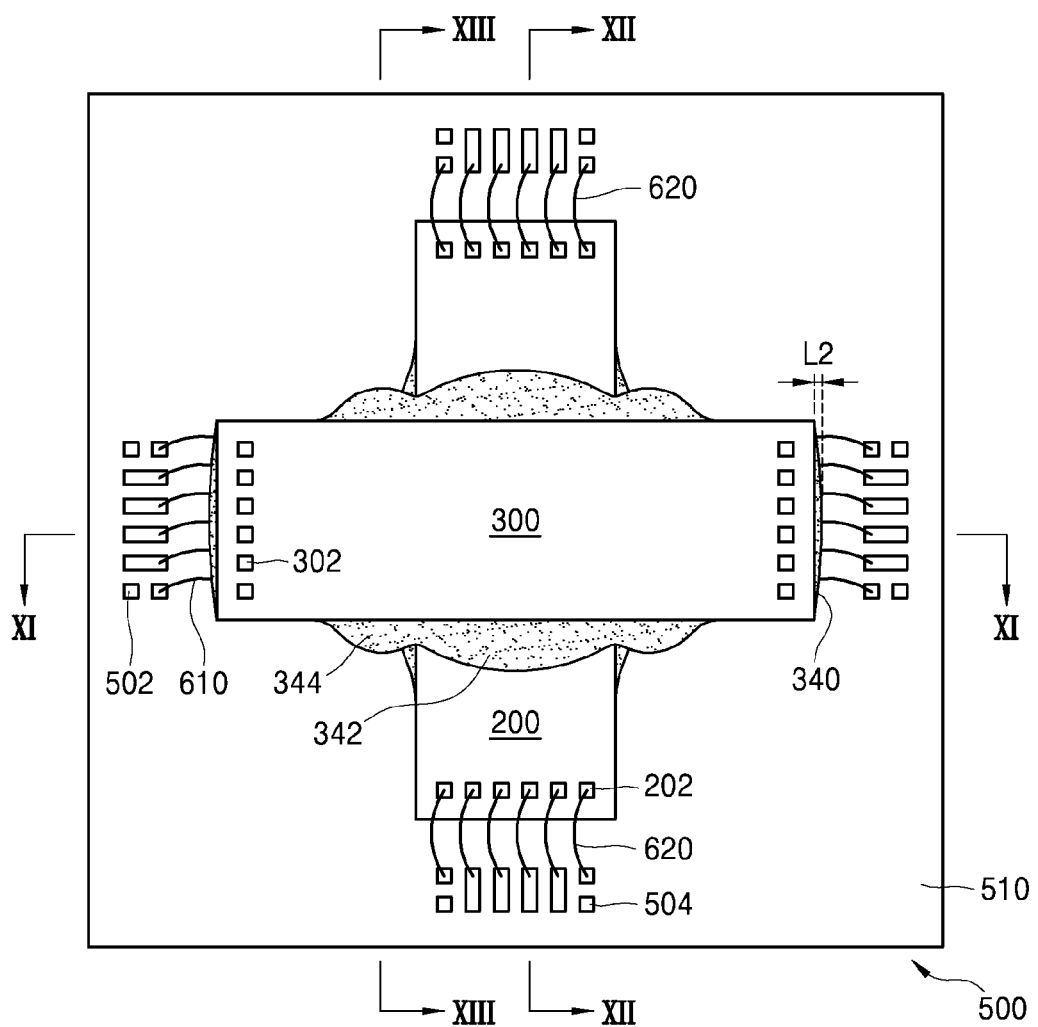
FIG. 10 is a plan view illustrating a stage in which a third semiconductor chip is attached onto a second semiconductor chip according to an embodiment of the inventive concept.

FIG. 10 is a plan view illustrating a stage in which a third semiconductor chip is attached onto a second semiconductor chip according to an embodiment of the inventive concept.

Figure 11:
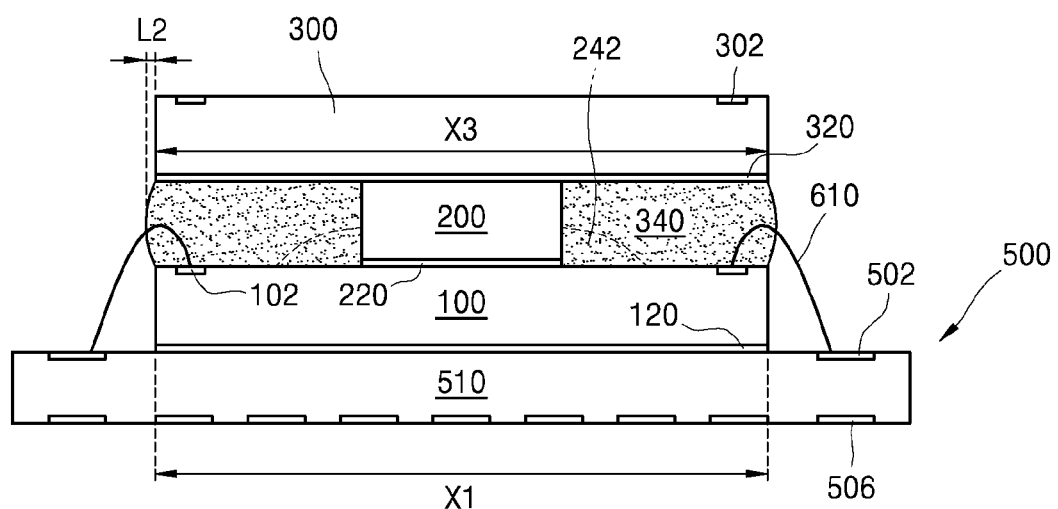
FIGS. 11 to 13 are cross-sectional views illustrating a stage in which a third semiconductor chip is attached onto a second semiconductor chip according to an embodiment of the inventive concept.
Figure 12:
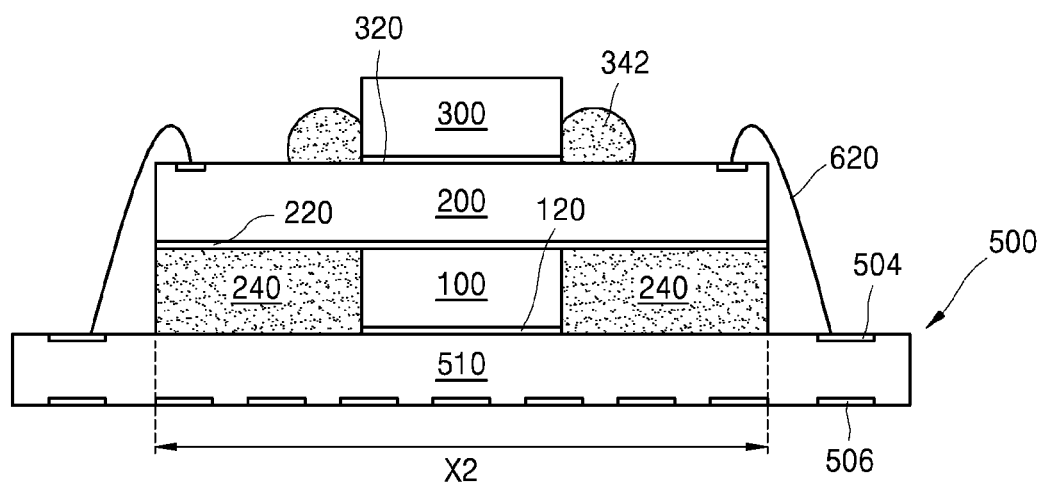
Figure 13:
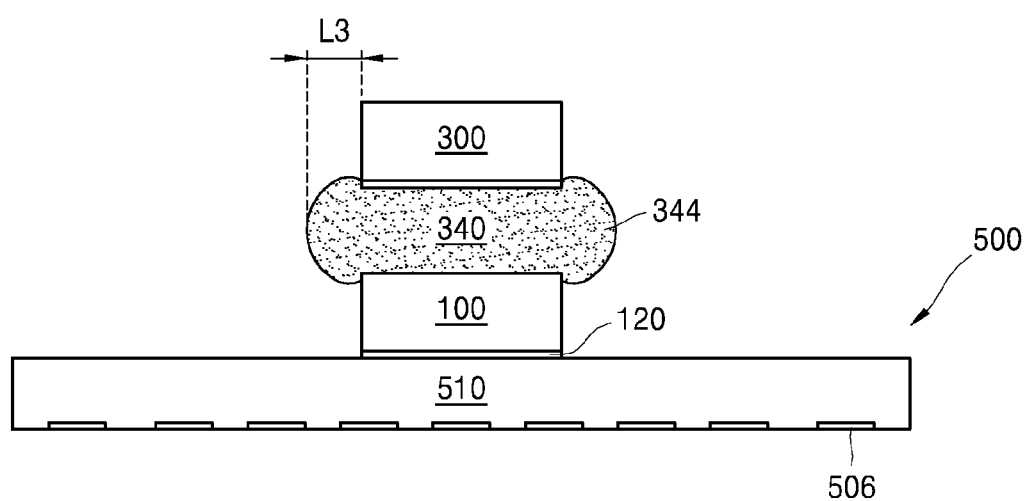

FIGS. 11 to 13 are cross-sectional views illustrating a stage in which a third semiconductor chip is attached onto a second semiconductor chip according to an embodiment of the inventive concept. Specifically, FIG. 11 is a cross-sectional view taken along a line XI-XI of FIG. 10, FIG. 12 is a cross-sectional view taken along a line XII-XII of FIG. 10, and FIG. 13 is a cross-sectional view taken along a line XIII-XIII of FIG. 10.

Referring to FIGS. 10 to 13, a third semiconductor chip 300 is attached onto the second semiconductor chip 200. The second semiconductor chip 300 may be attached onto the second semiconductor chip 200 such that an inactive surface faces the package base substrate 500, that is, the second semiconductor chip 200. The third semiconductor chip 300 may be attached onto the second semiconductor chip 200 after third DAFs 320 and 340 are attached to the inactive surface.

A semiconductor device may be formed on an active surface of the third semiconductor chip 300. That is, the semiconductor devices may be formed on a surface opposite to the inactive surface facing the package base substrate 500. The third semiconductor chip 300 and the semiconductor device formed on the third semiconductor chip 300 may be identical to or similar to the first semiconductor chip 100 and the semiconductor device formed on the first semiconductor chip 100, respectively, which have been described with reference to FIGS. 3 to 5, and thus a detailed description thereof is not repeated.

The third DAFs 320 and 340 include a first attaching layer 320 and a second attaching layer 340. Before the third semiconductor chip 300 is attached onto the second semiconductor chip 200, the first attaching layer 320 and the second attaching layer 340 of the third DAFs 320 and 340 may be identical to the first attaching layer 20 and the second attaching layer 40 of the DAF 10 illustrated in FIG. 1. That is, the third DAFs 320 and 340 may be similar to or otherwise correspond to the attachment of the DAF 10 of FIG. 1 to the third semiconductor chip 300. Thus, a detailed description of the first attaching layer 320 and the second attaching layer 340 of the third DAFs 320 and 340 is not repeated.

The third semiconductor chip 300 may be attached onto the second semiconductor chip 200 such that a major axis X3 intersects with the major axis X2 of the second semiconductor chip 200. The third semiconductor chip 300 may be attached onto the second semiconductor chip 200 such that the major axis X3 faces in a third direction (a horizontal direction in FIGS. 10 and 11). For example, the major axis X2 of the second semiconductor chip 200 and the major axis X3 of the third semiconductor chip 300 may be substantially perpendicular to each other. The first top pad 502 may be disposed on the package base substrate 500 such that the first top pad 502 is adjacent to both ends of the third semiconductor chip 300 in the direction of the major axis X3. The major axis X1 of the first semiconductor chip 100 and the major axis X3 of the third semiconductor chip 300 may extend in the same direction. The major axis X1 of the first semiconductor chip 100 and the major axis X3 of the third semiconductor chip 300 may be identical to each other in the sense that they extend in a direction that is substantially perpendicular to the main surface of the package base substrate 500.

In the drawings, for the convenience of denotation, the major axis X1 of the first semiconductor chip 100 and the major axis X3 of the third semiconductor chip 300 may be illustrated as parallel axes facing in the same direction.

When the third semiconductor chip 300 is attached onto the second semiconductor chip 200, pressure may be applied to the third semiconductor chip 300. Since the third attaching layer 340 of the third DAFs 320 and 340 has a relatively small weight-average molecular weight, portions of the second attaching layer 340 of the third DAFs 320 and 340 located at an intersection between the second semiconductor chip 200 and the third semiconductor chip 300 may be easily pushed from the bottom of the third semiconductor chip 300 to the periphery thereof. The thickness of the second attaching layer 340 of the third DAFs 320 and 340 may be set to be equal to or greater than the thickness of the second semiconductor chip 200 and the first attaching layer 220 of the second DAFs 220 and 240, such that the second attaching layer 340 of the third DAFs 320 and 340 may contact the top surface of the first semiconductor chip 100. Between the third semiconductor chip 300 and the first semiconductor chip 100, the third DAFs 320 and 340 may fill a space except a portion occupied by the second semiconductor chip 200 and the second DAF 220.

The second attaching layer 340 of the third DAFs 320 and 340 may cover a portion of the first bonding wire 610. Since the second attaching layer 340 of the third DAFs 320 and 340 has a relatively small weight-average molecular weight, the first bonding wire 610 may not be deformed.

The second semiconductor chip 200 and the first attaching layer 320 of the third DAFs 320 and 340 may contact each other. Alternatively, a portion of the second attaching layer 340 of the third DAFs 320 and 340 may be left between the second semiconductor chip 200 and the first attaching layer 320 of the third DAFs 320 and 340.

The second attaching layer 340 of the third DAFs 320 and 340 may cover a side surface of the second semiconductor chip 200 disposed under the third semiconductor chip 300. With respect to the second attaching layer 340 of the third DAFs 320 and 340, the portions pushed from the bottom of the third semiconductor chip 300 to the periphery thereof may be referred to as protrusion portions 342 and 344 of the third DAFs 320 and 340. The protrusion portions 342 and 344 of the third DAFs 320 and 340 may be collectively referred to as a second protrusion portion 342/344. That is, the second attaching layer 340 of the third DAFs 320 and 340 may have protrusion portions 342 and 344 that protrude from a range occupied by the third semiconductor chip 300 among the space between a level of the bottom surface of the third semiconductor chip 300 and a level of the top surface of the first semiconductor chip 100. The range occupied by the third semiconductor chip 300 among the space between the level of the bottom surface of the third semiconductor chip 300 and the level of the top surface of the first semiconductor chip 100 refers to a space that is defined under the third semiconductor chip 300 by the top surface of the first semiconductor chip 100 and a virtual surface extending vertically from an edge of the third semiconductor chip 300.

As illustrated in FIGS. 6 and 7, since a portion of the second attaching layer 240 of the second DAFs 220 and 240, that is, the first protrusion portion 242 of the second DAFs 220 and 240 is left on the top surface of the first semiconductor chip 100, the second attaching layer 340 of the third DAFs 320 and 340 may contact the first protrusion portion 242 of the second DAFs 220 and 240.

The protrusion portions 342 and 344 of the third DAFs 320 and 340 may include a first protrusion portion 342 contacting the top surface of the second semiconductor chip 200 on the top surface of the second semiconductor chip 200, and a second protrusion portion 344 contacting both side surfaces of the second semiconductor chip 200. The first protrusion portion 342 of the third DAFs 320 and 340 may contact a portion of the side surface of the third semiconductor chip 300. The first protrusion portion 342 of the third DAFs 320 and 340 may cover a portion of the top surface of the second semiconductor chip 200 that is adjacent to a boundary between the second semiconductor chip 200 and the third semiconductor chip 300. The second protrusion portion 344 of the third DAFs 320 and 340 refers to a portion that extends and protrudes in the direction of the major axis X2 of the second semiconductor chip 200 from a portion of the second attaching layer 340 of the third DAFs 320 and 340 within the range occupied by the third semiconductor chip 300 among the space between the level of the bottom surface of the third semiconductor chip 300 and the level of the top surface of the first semiconductor chip 100. The protrusion portions 342 and 344 of the third DAFs 320 and 340 may extend from one side surface of the second semiconductor chip 200 through the top surface of the second semiconductor chip 200 onto the other side surface of the second semiconductor chip 200.

Due to the volume of the first protrusion portion 242 of the second DAFs 220 and 240, in addition to the first protrusion portion 342 and the second protrusion portion 344 of the third DAFs 320 and 340, the second attaching layer 340 of the third DAFs 320 and 340 may have a convex shape protruding by a second length L2 from the range occupied by the third semiconductor chip 300 among the space between the level of the bottom surface of the third semiconductor chip 300 and the level of the top surface of the first semiconductor chip 100.

The second protrusion portion 344 of the third DAFs 320 and 340 may extend by a third length L3 in the direction of the major axis X2 of the second semiconductor chip 200. Due to the volume of the first protrusion portion 242 of the second DAFs 220 and 240, the third length L3 of the second protrusion portion 344 of the third DAFs 320 and 340 may be greater than the first length L1 illustrated in FIG. 9.

Due to the volume of the first protrusion portion 242 of the second DAFs 220 and 240, the shape of the second attaching layer 340 of the third DAFs 320 and 340 may vary depending on the fluidity or viscosity of the second attaching layer 340 of the third DAFs 320 and 340, and is not limited to the shape illustrated in FIGS. 10 and 11.

FIG. 14 is a plan view illustrating a stage in which a fourth semiconductor chip is attached onto a third semiconductor chip according to an embodiment of the inventive concept.

Figure 15:
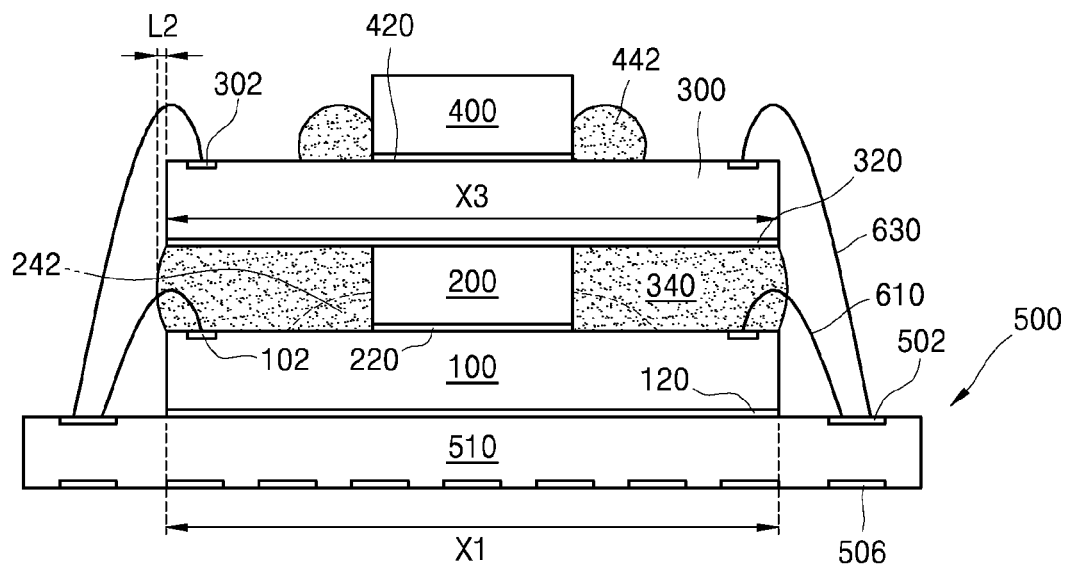
FIGS. 15 to 17 are cross-sectional views illustrating a stage in which a fourth semiconductor chip is attached onto a third semiconductor chip according to an embodiment of the inventive concept.
Figure 16:
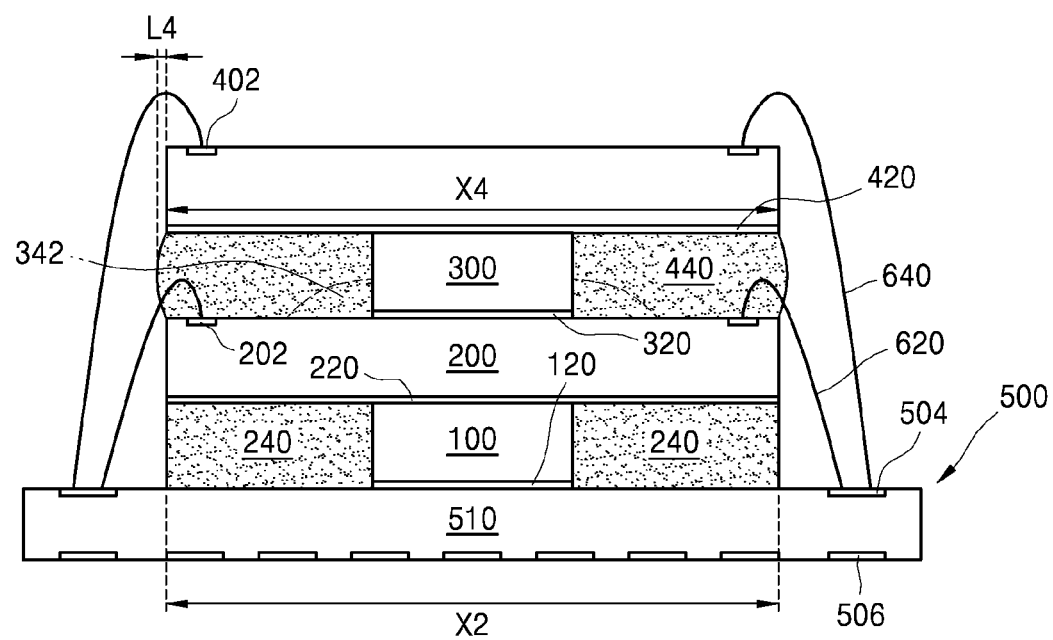
Figure 17:
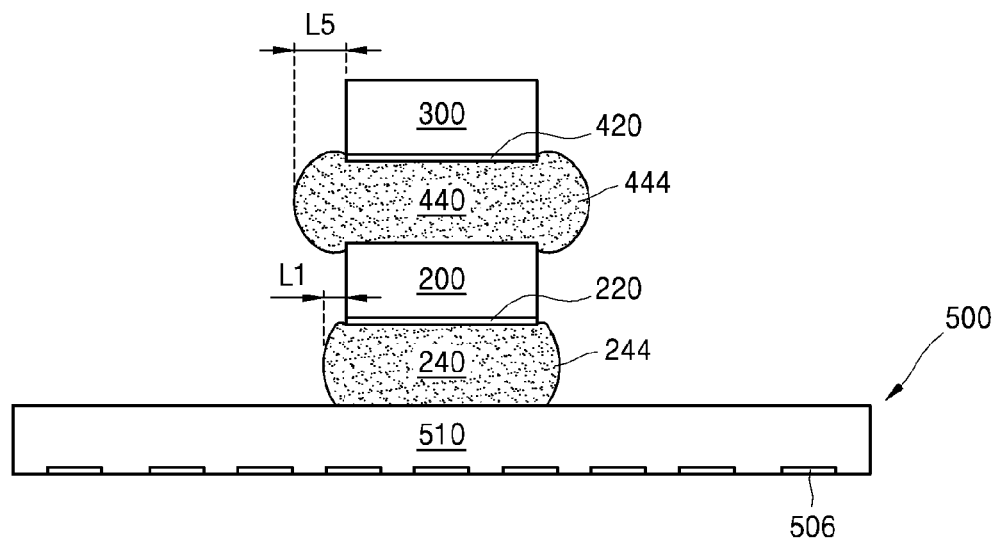

FIGS. 15 to 17 are cross-sectional views illustrating a stage in which a fourth semiconductor chip is attached onto a third semiconductor chip according to an embodiment of the inventive concept. Specifically, FIG. 15 is a cross-sectional view taken along a line XV-XV of FIG. 14, FIG. 16 is a cross-sectional view taken along a line XVI-XVI of FIG. 14, and FIG. 17 is a cross-sectional view taken along a line XVII-XVII of FIG. 14.

Referring to FIGS. 14 to 17, a fourth semiconductor chip 400 is attached onto the third semiconductor chip 300. The fourth semiconductor chip 400 may be attached onto the third semiconductor chip 300 such that an inactive surface faces the package base substrate 500, that is, the third semiconductor chip 300. The fourth semiconductor chip 400 may be attached onto the third semiconductor chip 300 after fourth DAFs 420 and 440 are attached to the inactive surface.

A semiconductor device may be formed on an active surface of the fourth semiconductor chip 400. That is, the semiconductor device may be formed on a surface opposite to the inactive surface facing the package base substrate 500. The fourth semiconductor chip 400 and the semiconductor device formed on the third semiconductor chip 400 may be identical to or similar to the first semiconductor chip 100 and the semiconductor device formed on the first semiconductor chip 100, respectively, which have been described with reference to FIGS. 3 to 5, and thus a detailed description thereof is not repeated.

The fourth DAFs 420 and 440 include a first attaching layer 420 and a second attaching layer 440. Before the fourth semiconductor chip 400 is attached onto the third semiconductor chip 300, the first attaching layer 420 and the second attaching layer 440 of the fourth DAFs 420 and 440 may be identical to the first attaching layer 20 and the second attaching layer 40 of the DAF 10 illustrated in FIG. 1. That is, the fourth DAFs 420 and 440 may be similar to or otherwise correspond to the attachment of the DAF 10 of FIG. 1 to the fourth semiconductor chip 400. Thus, a detailed description of the first attaching layer 420 and the second attaching layer 440 of the fourth DAFs 420 and 440 is not repeated.

The fourth semiconductor chip 400 may be attached onto the third semiconductor chip 300 such that a major axis X4 intersects with the major axis X3 of the third semiconductor chip 300. The fourth semiconductor chip 400 may be attached onto the third semiconductor chip 300 such that the major axis X4 faces in a fourth direction (a vertical direction in FIG. 14 and a horizontal direction in FIG. 16). For example, the major axis X3 of the third semiconductor chip 300 and the major axis X4 of the fourth semiconductor chip 400 may be substantially perpendicular to each other. The second top pad 504 may be disposed on the package base substrate 500 such that the second top pad 504 is adjacent to both ends of the fourth semiconductor chip 400 in the direction of the major axis X4. The major axis X2 of the second semiconductor chip 200 and the major axis X4 of the fourth semiconductor chip 400 may extend in the same direction. The major axis X2 of the second semiconductor chip 200 and the major axis X4 of the fourth semiconductor chip 400 may be identical to each other in the sense that they extend in a direction that is substantially perpendicular to the main surface of the package base substrate 500.

In the drawings, for the convenience of denotation, the major axis X2 of the second semiconductor chip 200 and the major axis X4 of the fourth semiconductor chip 400 may be illustrated as parallel axes facing in the same direction.

When the fourth semiconductor chip 400 is attached onto the third semiconductor chip 300, pressure may be applied to the fourth semiconductor chip 400. Since the second attaching layer 440 of the fourth DAFs 420 and 440 has a relatively small weight-average molecular weight, portions of the second attaching layer 440 of the fourth DAFs 420 and 440 located at an intersection between the third semiconductor chip 300 and the fourth semiconductor chip 400 may be easily pushed from the bottom of the fourth semiconductor chip 400 to the periphery thereof. The thickness of the second attaching layer 440 of the fourth DAFs 420 and 440 may be set to be equal to or greater than the thickness of the third semiconductor chip 300 and the first attaching layer 320 of the third DAFs 320 and 340, such that the second attaching layer 440 of the fourth DAFs 420 and 440 may contact the top surface of the second semiconductor chip 200. Between the fourth semiconductor chip 400 and the second semiconductor chip 200, the fourth DAFs 420 and 440 may fill a space except a portion occupied by the third semiconductor chip 300 and the third DAF 320.

The second attaching layer 440 of the fourth DAFs 420 and 440 may cover a portion of the second bonding wire 620. Since the second attaching layer 440 of the fourth DAFs 420 and 440 has a relatively small weight-average molecular weight, the second bonding wire 620 may not be deformed.

The third semiconductor chip 300 and the first attaching layer 420 of the fourth DAFs 420 and 440 may contact each other. Alternatively, a portion of the second attaching layer 440 of the fourth DAFs 420 and 440 may be left between the third semiconductor chip 300 and the first attaching layer 420 of the fourth DAFs 420 and 440.

The second attaching layer 440 of the fourth DAFs 420 and 440 may cover a side surface of the third semiconductor chip 300 disposed under the fourth semiconductor chip 400. Among the second attaching layer 440 of the fourth DAFs 420 and 440, the portions pushed from the bottom of the fourth semiconductor chip 400 to the periphery thereof may be referred to as protrusion portions 442 and 444 of the fourth DAFs 420 and 440. The protrusion portions 442 and 444 of the fourth DAFs 420 and 440 may be collectively referred to as a fourth protrusion portion 442/444. That is, the second attaching layer 440 of the fourth DAFs 420 and 440 may have protrusion portions 442 and 444 that protrude from a range occupied by the fourth semiconductor chip 400 among the space between a level of the bottom surface of the fourth semiconductor chip 400 and a level of the top surface of the second semiconductor chip 200. The range occupied by the fourth semiconductor chip 400 among the space between the level of the bottom surface of the fourth semiconductor chip 400 and the level of the top surface of the second semiconductor chip 200 refers to a space that is defined under the fourth semiconductor chip 400 by the top surface of the second semiconductor chip 200 and a virtual surface extending vertically from an edge of the fourth semiconductor chip 400.

As illustrated in FIGS. 10 and 12, since a portion of the second attaching layer 340 of the third DAFs 320 and 340, that is, the first protrusion portion 342 of the third DAFs 320 and 340 is left on the top surface of the second semiconductor chip 200, the second attaching layer 440 of the fourth DAFs 420 and 440 may contact the first protrusion portion 342 of the third DAFs 320 and 340.

The protrusion portions 442 and 444 of the fourth DAFs 420 and 440 may include a first protrusion portion 442 contacting the top surface of the third semiconductor chip 300 on the top surface of the third semiconductor chip 300 and a second protrusion portion 444 contacting both side surfaces of the third semiconductor chip 300. The first protrusion portion 442 of the fourth DAFs 420 and 440 may contact a portion of the side surface of the fourth semiconductor chip 400. The first protrusion portion 442 of the fourth DAFs 420 and 440 may cover a portion of the top surface of the third semiconductor chip 300 that is adjacent to a boundary between the third semiconductor chip 300 and the fourth semiconductor chip 400. The second protrusion portion 444 of the fourth DAFs 420 and 440 refers to a portion that extends and protrudes in the direction of the major axis X3 of the third semiconductor chip 300 from a portion of the second attaching layer 440 of the fourth DAFs 420 and 440 within the range occupied by the fourth semiconductor chip 400 among the space between the level of the bottom surface of the fourth semiconductor chip 400 and the level of the top surface of the second semiconductor chip 200. The protrusion portions 420 and 444 of the fourth DAFs 420 and 440 may extend from one side surface of the third semiconductor chip 300 through the top surface of the third semiconductor chip 300 onto the other side surface of the third semiconductor chip 300.

Due to the volume of the first protrusion portion 242 of the second DAFs 220 and 240, in addition to the first protrusion portion 342 and the second protrusion portion 344 of the third DAFs 320 and 340, the second attaching layer 340 of the third DAFs 320 and 340 may have a convex shape protruding by a fourth length L4 from the range occupied by the fourth semiconductor chip 400 among the space between the level of the bottom surface of the fourth semiconductor chip 400 and the level of the top surface of the second semiconductor chip 200. The fourth length L4 may be equal to or similar to the second length L2.

The second protrusion portion 444 of the fourth DAFs 420 and 440 may extend by a fifth length L5 in the direction of the major axis X3 of the third semiconductor chip 300. Due to the volume of the first protrusion portion 342 of the third DAFs 320 and 340, the fifth length L5 of the second protrusion portion 444 of the fourth DAFs 420 and 440 may be greater than the first length L1. The fifth length L5 of the second protrusion portion 444 of the fourth DAFs 420 and 440 may be equal to or similar to the third length L3 illustrated in FIG. 13.

The length of the protrusion portions 242 and 244 (i.e., the first protrusion portions 242 and 244) of the second DAFs 220 and 240 in the direction of the major axis X1 of the first semiconductor chip 100 may be smaller than the length of the protrusion portions 442 and 444 (i.e., the third protrusion portions 442 and 444) of the fourth DAFs 420 and 440 in the direction of the major axis X3 of the third semiconductor chip 300.

Due to the volume of the first protrusion portion 342 of the third DAFs 320 and 340, the shape of the second attaching layer 440 of the fourth DAFs 420 and 440 may vary depending on the fluidity or viscosity of the second attaching layer 440 of the fourth DAFs 420 and 440, and is not limited to the shape illustrated in FIGS. 14 and 17.

A bonding wire 630 or other suitable conductor may be formed to connect the third semiconductor chip 300 and the package base substrate 500. A bonding wire 640 or other suitable conductor may be formed to connect the fourth semiconductor chip 400 and the package base substrate 500.

The third bonding wire 630 connecting the third semiconductor chip 300 and the package base substrate 500 may be formed before or after the fourth semiconductor chip 400 is attached onto the third semiconductor chip 300. The fourth bonding wire 640 connecting the fourth semiconductor chip 400 and the package base substrate 500 may be formed after the fourth semiconductor chip 400 is attached onto the third semiconductor chip 300.

The third bonding wire 630 may connect the third bonding pad 302 of the third semiconductor chip 300 and the first top pad 502 of the package base substrate 500 to electrically connect the third semiconductor chip 300 and the package base substrate 500. The fourth bonding wire 640 may connect the fourth bonding pad 402 of the fourth semiconductor chip 400 and the second top pad 504 of the package base substrate 500 to electrically connect the fourth semiconductor chip 400 and the package base substrate 500. When the second top pad 504 includes the isolation pads 504a and 504b, the second bonding wire 620 may connect the first isolation pad 504a of the second top pad 504 and the second bonding pad 202. The second isolation pad 504b of the second top pad 504 may be connected through a bonding pad of a semiconductor chip different from the second semiconductor chip 200, for example, through a fourth bonding pad 402 of a fourth semiconductor chip 400 as illustrated in FIG. 14—e.g., a fourth bonding wire 640 as further described below. By way of another example, when the second top pad 504 includes the common pad 504c, the second bonding wire 620 may connect the common pad 504c of the second top pad 504 and the second bonding pad 202.

When the third bonding wire 630 is connected to the third bonding pad 302 (e.g., in a wire bonding process), pressure may be applied to the third semiconductor chip 300. However, since the second attaching layer 340 of the third DAFs 320 and 340 fills a space under the third semiconductor chip 300, the third semiconductor chip 300 does not warp in the wire bonding process for connecting the third bonding wire 630 to the third bonding pad 302. Therefore, the third semiconductor chip 300 may be formed to be relatively thin. Likewise, when the fourth bonding wire 640 is connected to the fourth bonding pad 402 (e.g., in a wire bonding process), pressure may be applied to the fourth semiconductor chip 400. However, since the second attaching layer 440 of the fourth DAFs 420 and 440 fills a space under the fourth semiconductor chip 400, the fourth semiconductor chip 400 does not warp in the wire bonding process for connecting the fourth bonding wire 640 to the fourth bonding pad 402. Therefore, the fourth semiconductor chip 400 may be formed to be relatively thin.

Figure 18:
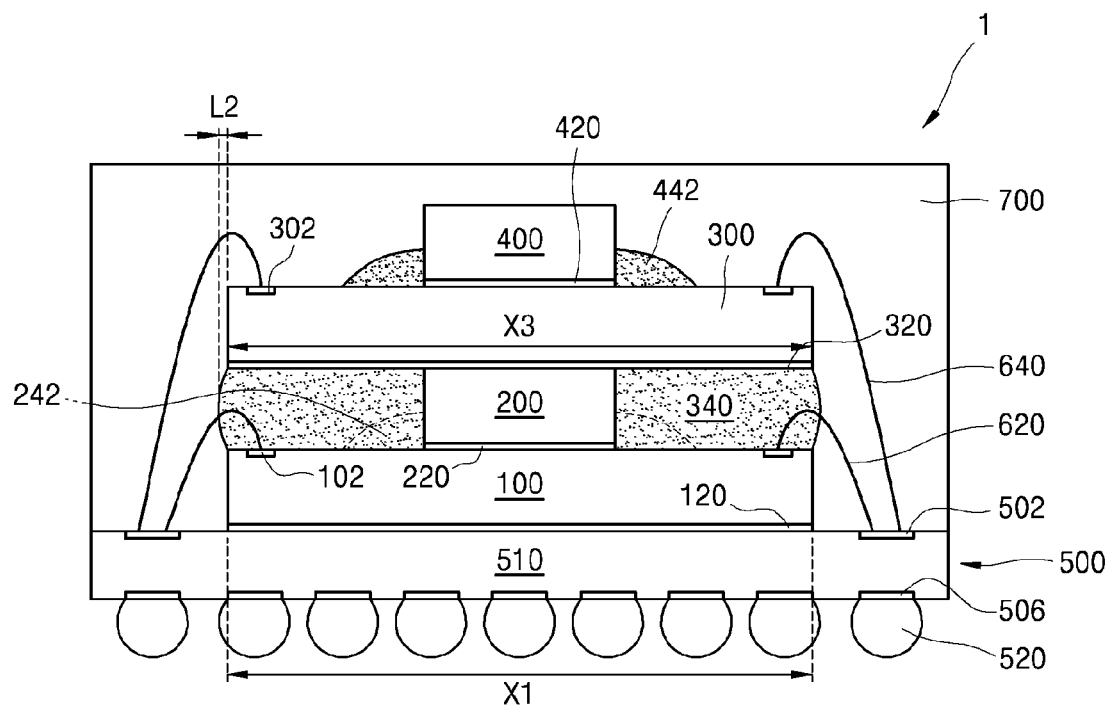
FIGS. 18 and 19 are cross-sectional views illustrating an aspect of a semiconductor package according to an embodiment of the inventive concept.
Figure 19:
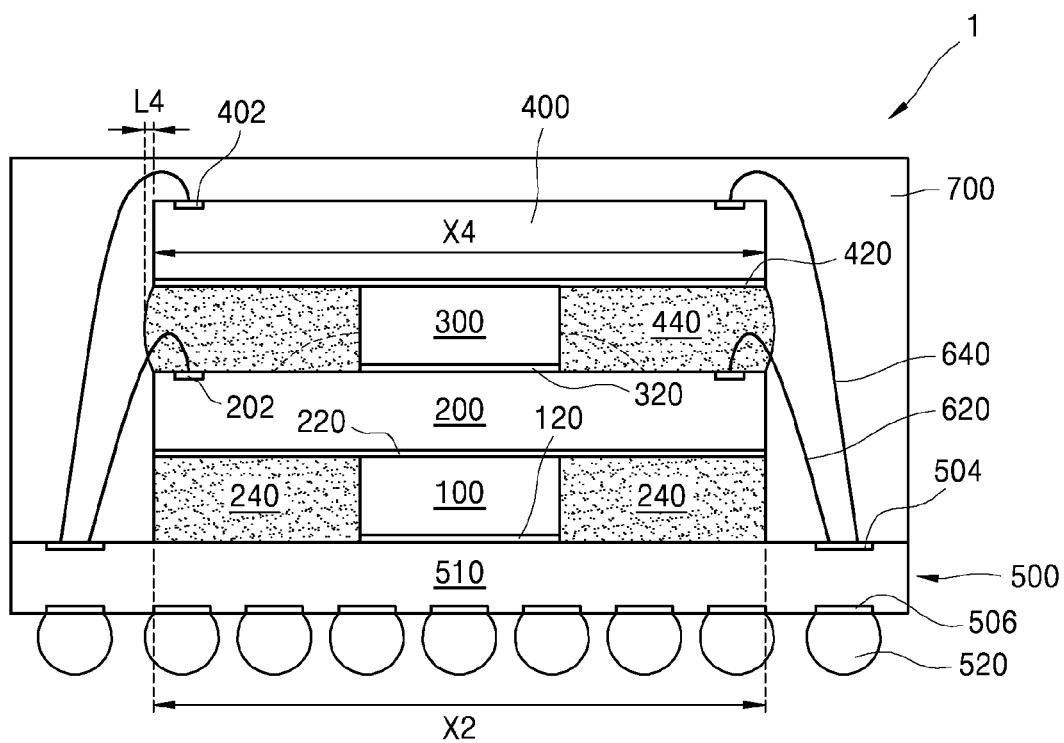

FIGS. 18 and 19 are cross-sectional views illustrating an aspect of a semiconductor package 1 according to an embodiment of the inventive concept. Specifically, FIGS. 18 and 19 are cross-sectional views taken along corresponding respectively to the cross-sectional views of FIGS. 15 and 16.

Referring to FIGS. 18 and 19, the semiconductor package 1 includes a package base substrate 500 and first to fourth semiconductor chips 100, 200, 300 and 400. A molding member 700 covering the first to fourth semiconductor chips 100, 200, 300 and 400 may be formed on the package base substrate 500. The molding member 700 may cover the first to fourth semiconductor chips 100, 200, 300 and 400, first to fourth bonding wires 610, 620, 630 and 640, and first to fourth DAFs 120, 220/240, 320/340 and 420/440. The molding member 700 may include, for example, an epoxy molding compound (EMC).

The upper chips, that is, the second to fourth semiconductor chips 200, 300 and 400 may be attached respectively onto the lower chips, that is, the first to third semiconductor chips 100, 200 and 300. The second to fourth DAFs 220/240, 320/340 and 420/440 may be attached respectively to the bottom surfaces of the upper chips, that is, the second to fourth semiconductor chips 200, 300 and 400, and may respectively cover at least portions of the lower chips, that is, the first to third semiconductor chips 100, 200 and 300. At least portions of the side surfaces of the first to third semiconductor chips 100, 200 and 300 may be covered by the semiconductor chips 200, 300 and 400. Each of the second to fourth DAFs 220/240, 320/340 and 420/440 may be a multi-layer film including a first attaching layer 220/320/420 contacting the bottom surface of the second/third/fourth semiconductor chip 200/300/400, respectively, and a second attaching layer 240/340/440 contacting the bottom surface of the first attaching layer 220/320/420, respectively. A weight-average molecular weight of a binder component of the first attaching layer 220/320/420 of the second/third/fourth DAF 220/240/320/340/420/440, respectively, may be larger than a weight-average molecular weight of the second attaching layer 240/340/440, respectively.

The binder component of the first attaching layer 220/320/420 of the second/third/fourth DAF 220/240/320/340/420/

440, respectively, may include a first binder material and a second binder material, the second binder material having a smaller weight-average molecular weight than the first binder material. The binder component of the second attaching layer 240/340/440 of the second/third/fourth DAF 220/240/320/340/420/440, respectively, may include a material that is identical to or similar to the second binder material.

A first DAF 120 for attaching the first semiconductor chip 100 onto the package base substrate 500 may be attached to a bottom surface of the lowermost chip, that is, the first semiconductor chip 100. The first DAF 120 may be a single film including a binder component that has a larger weight-average molecular weight than the binder component of the second attaching layer 240/340/440 of the second/third/fourth DAF 220/240/320/340/420/440, respectively. The weight-average molecular weight of the binder component of the first DAF 120 may be equal to or similar to the weight-average molecular weight of the binder component of the first attaching layer 220/320/420 of the second/third/fourth DAF 220/240/320/340/420/440, respectively.

The first attaching layer 220/320/420 of the second/third/fourth DAF 220/240/320/340/420/440, respectively, may contact the top surface of the lower layer, that is, the first/second/third semiconductor chip 100/200/300, respectively. The second attaching layer 440 of the fourth DAF 420/440 may cover a portion of the top surface of the third semiconductor chip 300 that is adjacent to a boundary between the third semiconductor chip 300 and the fourth semiconductor chip 400. The second attaching layer 440 of the fourth DAF 420/440 may expose a portion of the top surface of the third semiconductor chip 300.

The first to fourth semiconductor chips 100, 200, 300 and 400 may be sequentially stacked on the package base substrate 500 such that the major axes X1, X2, X3 and X4 intersect with each other. That is, the second semiconductor chip 200 may be attached onto the first semiconductor chip 100 such that the major axis X2 intersects with the major axis X1 of the first semiconductor chip 100, the third semiconductor chip 300 may be attached onto the second semiconductor chip 200 such that the major axis X3 intersects with the major axis X2 of the second semiconductor chip 200, and the fourth semiconductor chip 400 may be attached onto the third semiconductor chip 300 such that the major axis X4 intersects with the major axis X3 of the third semiconductor chip 300.

When the second/third/fourth bonding wire 620/630/640 is connected to the second/third/fourth bonding pad 202/302/402, respectively (e.g., in a wire bonding process), pressure may be applied to the second/third/fourth semiconductor chip 200/300/400, respectively. However, since the second attaching layer 240/340/440 of the second/third/fourth DAF 220/240/320/340/420/440, respectively, fills a space under the second/third/fourth semiconductor chip 200/300/400, respectively, the second/third/fourth semiconductor chip 200/300/400 does not warp in the wire bonding process for connecting the second/third/fourth bonding wire 620/630/640, respectively, to the second/third/fourth bonding pad 202/302/402, respectively. Therefore, the second/third/fourth semiconductor chip 200/300/400 may be formed to be relatively thin. Therefore, the volume of the semiconductor package 1 may be reduced and minimized.

Also, since the second attaching layer 240/340/440 of the second/third/fourth DAF 220/240/320/340/420/440, respectively, fills a space under the second/third/fourth semiconductor chip 200/300/400, respectively, before the molding member is formed, it is not necessary to fill the bottom of the second/third/fourth semiconductor chip 200/300/400 with the molding member 700. Therefore, it is possible to prevent a non-filling defect that may occur when the molding member 700 fails to completely fill the inside of the semiconductor package 1.

An external connection terminal 520 may be attached onto the bottom pad 506 of the package base substrate 500 to transmit signals between the semiconductor package 1 and an external device and/or to supply power to the semiconductor package 1.

Figure 20:
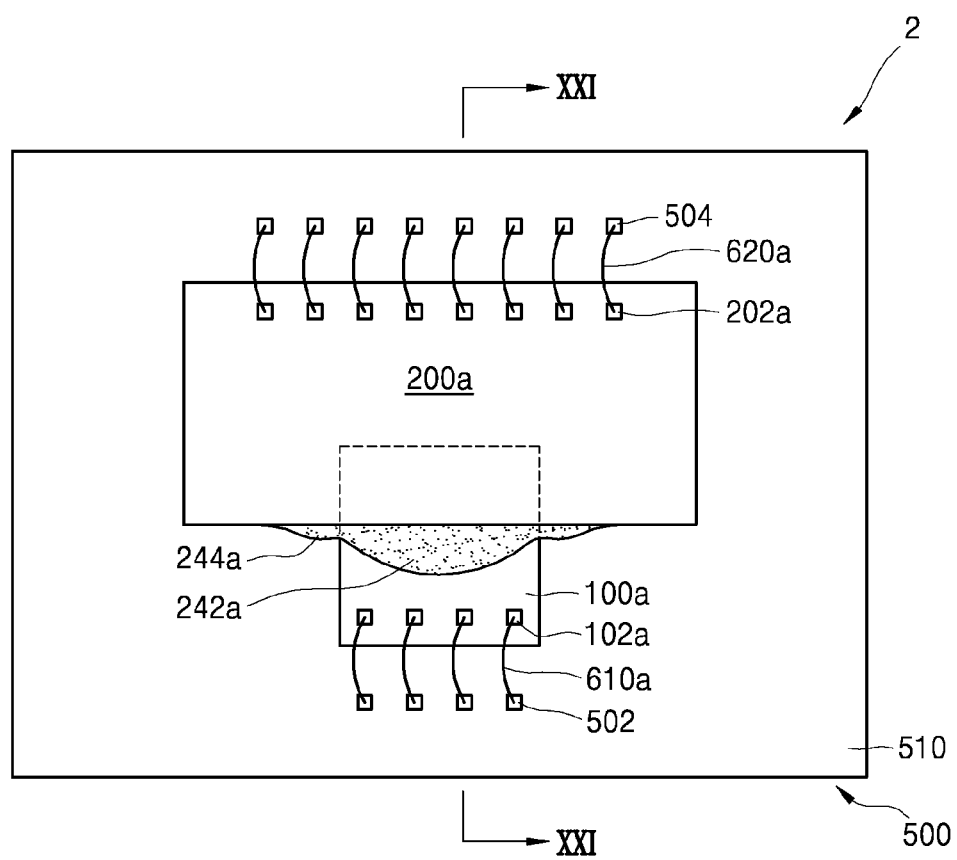
FIG. 20 is a plan layout view schematically illustrating another aspect of a semiconductor package according to an embodiment of the inventive concept.
Figure 21:
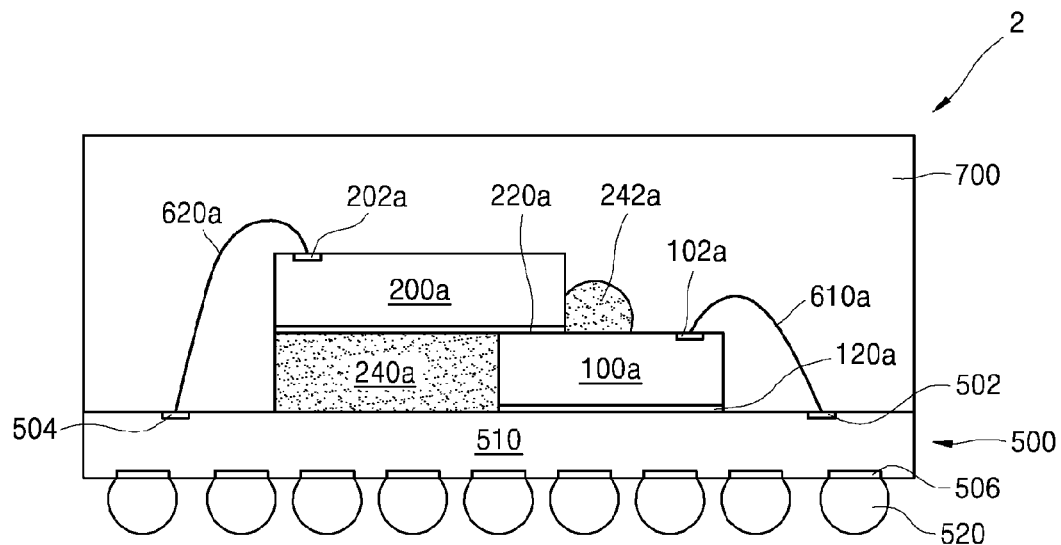
FIG. 21 is a cross-sectional view illustrating another aspect of a semiconductor package according to an embodiment of the inventive concept.

FIG. 20 is a plan layout view schematically illustrating another aspect of a semiconductor package 2 according to an embodiment of the inventive concept. FIG. 21 is a cross-sectional view illustrating another aspect of a semiconductor package 2 according to an embodiment of the inventive concept. Specifically, FIG. 21 is a cross-sectional view taken along a line XXI-XXI of FIG. 20. For the sake of visibility of components, a molding member is omitted in FIG. 20.

Referring to FIGS. 20 and 21, the semiconductor package 2 includes a lower chip 100a attached onto a package base substrate 500 and an upper chip 200a attached onto the lower chip 100a. A molding member 700 covering the lower chip 100a and the upper chip 200a may be formed on the package base substrate 500.

A first DAF 120a for attaching the lower chip 100a onto the package base substrate 500 may be attached to a bottom surface of the lower chip 100a. Second DAFs 220a and 240a covering at least a portion of the lower chip 100a may be attached to a bottom surface of the upper chip 200a. The second DAFs 220a and 240a may be a multi-layer film that includes a first attaching layer 220a contacting the bottom surface of the upper chip 200a and a second attaching layer 240a attached to a bottom surface of the first attaching layer 220a to cover a portion of a side surface of the lower chip 100a. The first attaching layer 220a and the second attaching layer 240a of the second DAFs 220a and 240a may be identical to the first attaching layer 20 and the second attaching layer 40 of the DAF 10 illustrated in FIG. 1. That is, the second DAFs 220a and 240a may correspond to the attachment of the DAF 10 of FIG. 1 to the upper chip 200a. Thus, a detailed description of the first attaching layer 220a and the second attaching layer 240a of the second DAFs 220a and 240a is not repeated.

Each of the first attaching layer 220a and the second attaching layer 240a may include a binder component. A weight-average molecular weight of the binder component of the first attaching layer 220a may be larger than a weight-average molecular weight of the binder component of the second attaching layer 240a. The binder component of the first attaching layer 220a may include a first binder material and a second binder material that has a smaller weight-average molecular weight than the first binder material. The binder component of the second attaching layer 240a may include a material that is identical to or similar to the second binder material.

The first DAF 120a may be a single film including a binder component that has a larger weight-average molecular weight than the binder component of the second attaching layer 240a of the second DAFs 220a and 240a.

The upper chip 200a may be attached onto the lower chip 100a to expose a portion of the top surface of the lower chip 100a. A lower bonding pad 102a may be formed in the portion of the top surface of the lower chip 100a exposed by the upper chip 200a. An upper bonding pad 202a may be formed on the top surface of the upper chip 200a.

A first bonding wire 610a that electrically connects the lower chip 100a and the package base substrate 500 may be formed between the lower bonding pad 102a of the lower chip 100a and the first top pad 502 of the package base substrate

500. A second bonding wire 620*a* that electrically connects the upper chip 200*a* and the package base substrate 500 may be formed between the upper bonding pad 202*a* of the upper chip 200*a* and the second top pad 504 of the package base substrate 500.

The first attaching layer 220*a* of the second DAFs 220*a* and 240*a* may contact the top surface of the lower chip 100*a*. The second attaching layer 240*a* of the second DAFs 220*a* and 240*a* may have protrusion portions 242*a* and 244*a* that protrude from a range occupied by the upper chip 200*a* among the space between a level of the bottom surface of the upper chip 200*a* and a level of the top surface of the package base substrate 500. The protrusion portions 242*a* and 244*a* may cover a portion of the top surface of the lower chip 100*a*. The protrusion portions 242*a* and 244*a* may include a first protrusion portion 242*a* contacting the top surface of the upper chip 100*a* on the top surface of the upper chip 100*a* and a second protrusion portion 244*a* contacting both side surfaces of the lower chip 100*a*. The first protrusion portion 242*a* may contact a portion of the side surface of the upper chip 200*a*. The first protrusion portion 242*a* may cover a portion of the top surface of the lower chip 100*a* that is adjacent to a boundary between the upper chip 200*a* and the lower chip 100*a*. The protrusion portions 242*a* and 244*a* may extend from one side surface of the lower chip 100*a* through the top surface of the lower chip 100*a* onto the other side surface of the lower chip 100*a*.

When the second bonding wire 620*a* is connected to the second bonding pad 202*a* (e.g., in a wire bonding process), pressure may be applied to the upper chip 200*a*. However, since the second attaching layer 240*a* fills a space under the upper chip 200*a*, the upper chip 200*a* does not warp in the wire bonding process for connecting the second bonding wire 620*a* to the upper bonding pad 202*a*. Therefore, the upper chip 200*a* may be formed to be relatively thin.

Also, since the second attaching layer 240*a* fills a space under the upper chip 200*a*, it is possible to prevent a non-filling defect that may occur when the molding member 700 fails to completely fill the inside of the semiconductor package 2.

Figure 22:
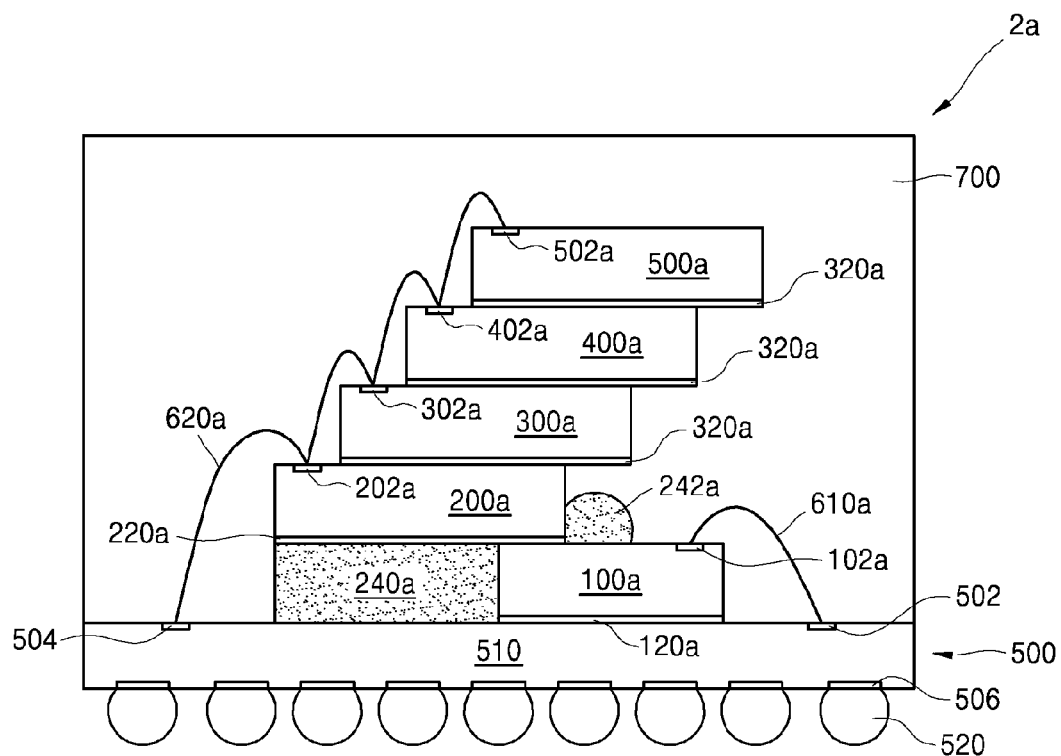
FIG. 22 is a cross-sectional view illustrating another aspect of a semiconductor package according to an embodiment of the inventive concept.

FIG. 22 is a cross-sectional view illustrating another aspect of a semiconductor package 2*a* according to a modification of an embodiment of the inventive concept. A description of an overlap with the semiconductor package 2 illustrated in FIGS. 20 and 21 is not repeated herein.

Referring to FIG. 22, unlike the semiconductor package 2 of FIG. 21, the semiconductor package 2*a* may include a lower chip 100*a* and a plurality of upper chips 200*a*, 300*a*, 400*a* and 500*a* stacked on the lower chip 100*a*. The upper chips 200*a*, 300*a*, 400*a* and 500*a* may be sequentially stacked on the lower chip 100*a* such that they are shifted by a predetermined distance in a horizontal direction of the package base substrate 500 to expose a portion of the top surface of the lower chip. The second bonding wire 620*a* may connect the upper pads 202*a*, 302*a*, 402*a* and 502*a* of the upper chips 200*a*, 300*a*, 400*a* and 500*a* to the second top pad 504 of the package base substrate 500.

The upper chips 300*a*, 400*a* and 500*a* stacked on the lowermost upper chip 200*a* among the upper chips 200*a*, 300*a*, 400*a* and 500*a* may be attached respectively onto the upper chips 200*a*, 300*a* and 400*a* by a DAF including first attaching layers 320*a*, 420*a* and 520*a*.

Figure 23:
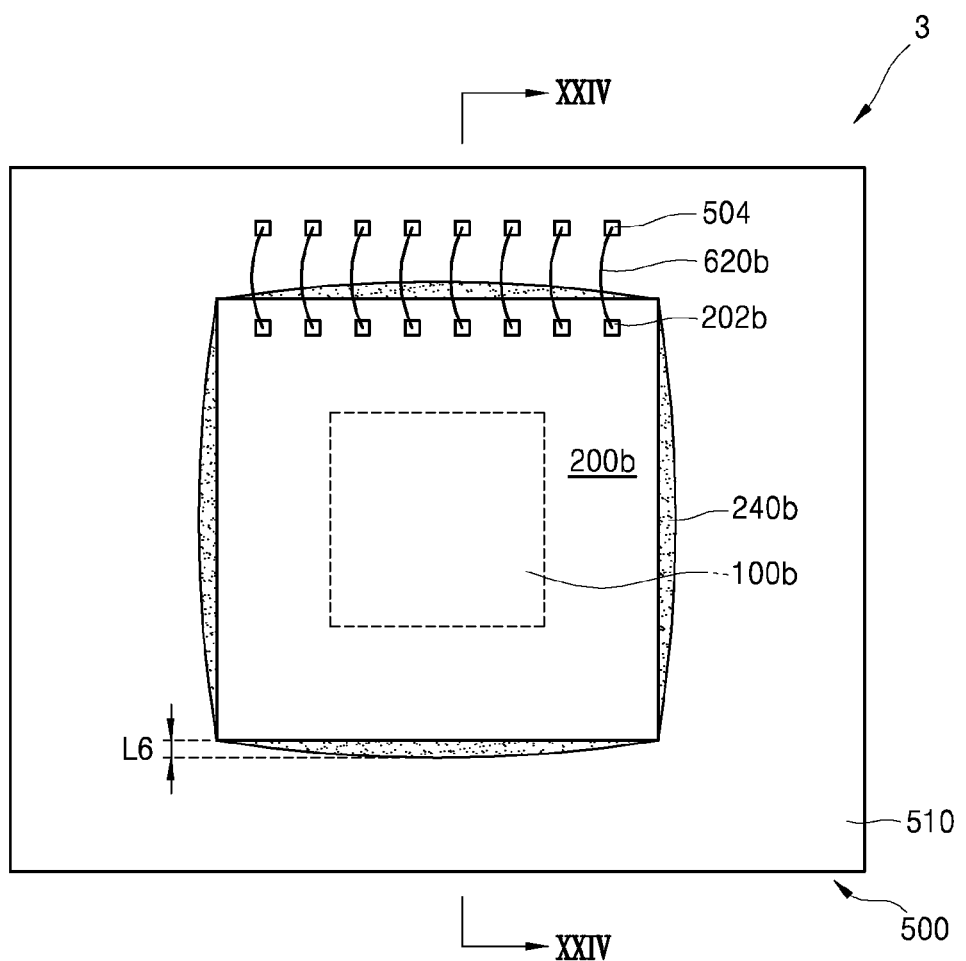
FIG. 23 is a plan layout view schematically illustrating another aspect of a semiconductor package according to an embodiment of the inventive concept.
Figure 24:
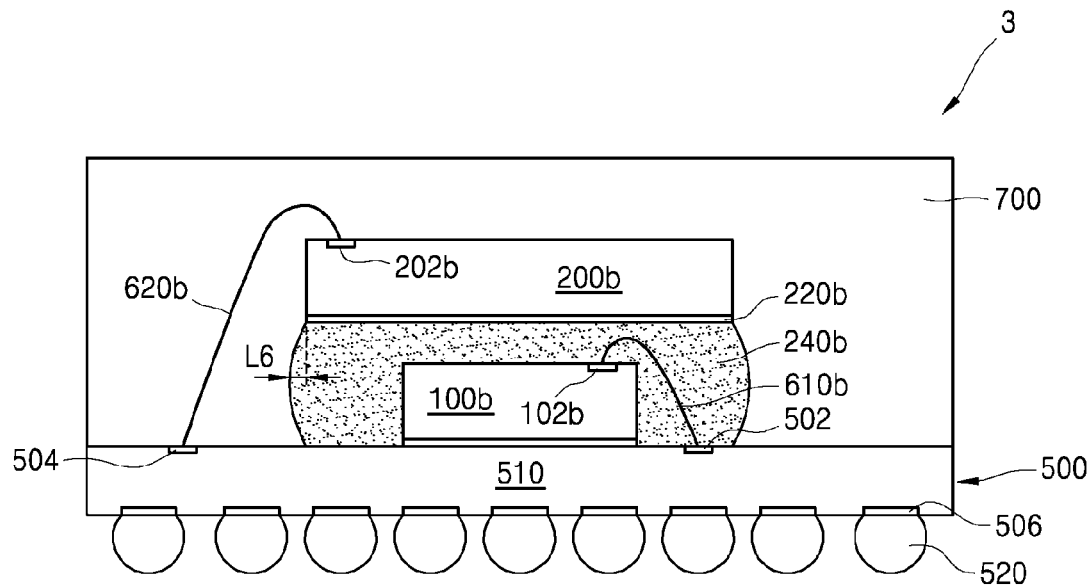
FIG. 24 is a cross-sectional view illustrating another aspect of a semiconductor package according to an embodiment of the inventive concept.

FIG. 23 is a plan layout view schematically illustrating another aspect of a semiconductor package 3 according to an embodiment of the inventive concept. FIG. 24 is a cross-sectional view illustrating another aspect of a semiconductor package 3 according to an embodiment of the inventive concept. Specifically, FIG. 24 is a cross-sectional view taken along a line XXIV-XXIV of FIG. 21. For the sake of visibility of components, a molding member is omitted in FIG. 23.

Referring to FIGS. 23 and 24, the semiconductor package 3 includes a lower chip 100*b* attached onto a package base substrate 500 and an upper chip 200*b* attached onto the lower chip 100*b*. A molding member 700 covering the lower chip 100*b* and the upper chip 200*b* may be formed on the package base substrate 500.

A first DAF 120*b* for attaching the lower chip 100*b* onto the package base substrate 500 may be attached to a bottom surface of the lower chip 100*b*. Second DAFs 220*b* and 240*b* covering the lower chip 100*b* may be attached to a bottom surface of the upper chip 200*b*. The second DAFs 220*b* and 240*b* may be a multi-layer film that includes a first attaching layer 220*b* contacting the bottom surface of the upper chip 200*b* and a second attaching layer 240*b* attached to a bottom surface of the first attaching layer 220*b* to cover the lower chip 100*b*. The first attaching layer 220*b* and the second attaching layer 240*b* of the second DAFs 220*b* and 240*b* may be identical to the first attaching layer 20 and the second attaching layer 40 of the DAF 10 illustrated in FIG. 1. That is, the second DAFs 220*b* and 240*b* may be similar to or otherwise correspond to the attachment of the DAF 10 of FIG. 1 to the upper chip 200*b*. Thus, a detailed description of the first attaching layer 220*b* and the second attaching layer 240*b* of the second DAFs 220*b* and 240*b* is not repeated.

Each of the first attaching layer 220*b* and the second attaching layer 240*b* may include a binder component. A weight-average molecular weight of the binder component of the first attaching layer 220*b* may be larger than a weight-average molecular weight of the binder component of the second attaching layer 240*b*. The binder component of the first attaching layer 220*b* may include a first binder material and a second binder material that has a smaller weight-average molecular weight than the first binder material. The binder component of the second attaching layer 240*b* may include a material that is identical to or similar to the second binder material.

The first DAF 120*b* may be a single film including a binder component that has a larger weight-average molecular weight than the binder component of the second attaching layer 240*b* of the second DAFs 220*b* and 240*b*.

The upper chip 200*b* may be attached onto the lower chip 100*b* to cover the top surface of the lower chip 100*b* in the vertical direction with respect to the main surface of the package base substrate 500. A lower bonding pad 102*b* may be formed in a portion of the top surface of the lower chip 100*b*. An upper bonding pad 202*b* may be formed on the top surface of the upper chip 200*b*.

A first bonding wire 610*b* that electrically connects the lower chip 100*b* and the package base substrate 500 may be formed between the lower bonding pad 102*b* of the lower chip 100*b* and the first top pad 502 of the package base substrate 500. The first top pad 502 of the package base substrate 500 may be completely covered by the upper chip 200*b* in the vertical direction with respect to the main surface of the package base substrate 500. Alternatively, all or a portion of the first top pad 502 of the package base substrate 500 may be completely covered by the upper chip 200*b* in the vertical direction with respect to the main surface of the package base substrate 500. A second bonding wire 620*b* that electrically connects the upper chip 200*b* and the package base substrate 500 may be formed between the upper bonding pad 202*b* of the upper chip 200*b* and the second top pad 504 of the package base substrate 500.

The second attaching layer 240b of the second DAFs 220b and 240b may cover all of the top surface and the side surface of the lower chip 100b. The second attaching layer 240 of the second DAFs 220b and 240b may cover all or a portion of the second bonding wire 620b. Due to the volume of the lower chip 100b, the second attaching layer 240b of the second DAFs 220b and 240b may have a protrusion portion that protrudes from a range occupied by the upper chip 200b among the space between a level of the bottom surface of the upper chip 200b and a level of the top surface of the package base substrate 500. The protrusion portion may have a convex shape that protrudes by a sixth length L6 in a horizontal direction with respect to the main surface of the package base substrate 500 from the range occupied by the upper chip 200b among the space between the level of the bottom surface of the upper chip 200b and the level of the top surface of the package base substrate 500.

When the second bonding wire 620b is connected to the second bonding pad 202b (e.g., in a wire bonding process), pressure may be applied to the upper chip 200b. However, since the second attaching layer 240b fills a space under the upper chip 200b, the upper chip 200b does not warp in the wire bonding process for connecting the second bonding wire 620b to the upper bonding pad 202b. Therefore, the upper chip 200b may be formed to be relatively thin.

Also, since the second attaching layer 240b fills a space under the upper chip 200b, it is possible to prevent a non-filling defect that may occur when the molding member 700 fails to completely fill the inside of the semiconductor package 3.

Figure 25:
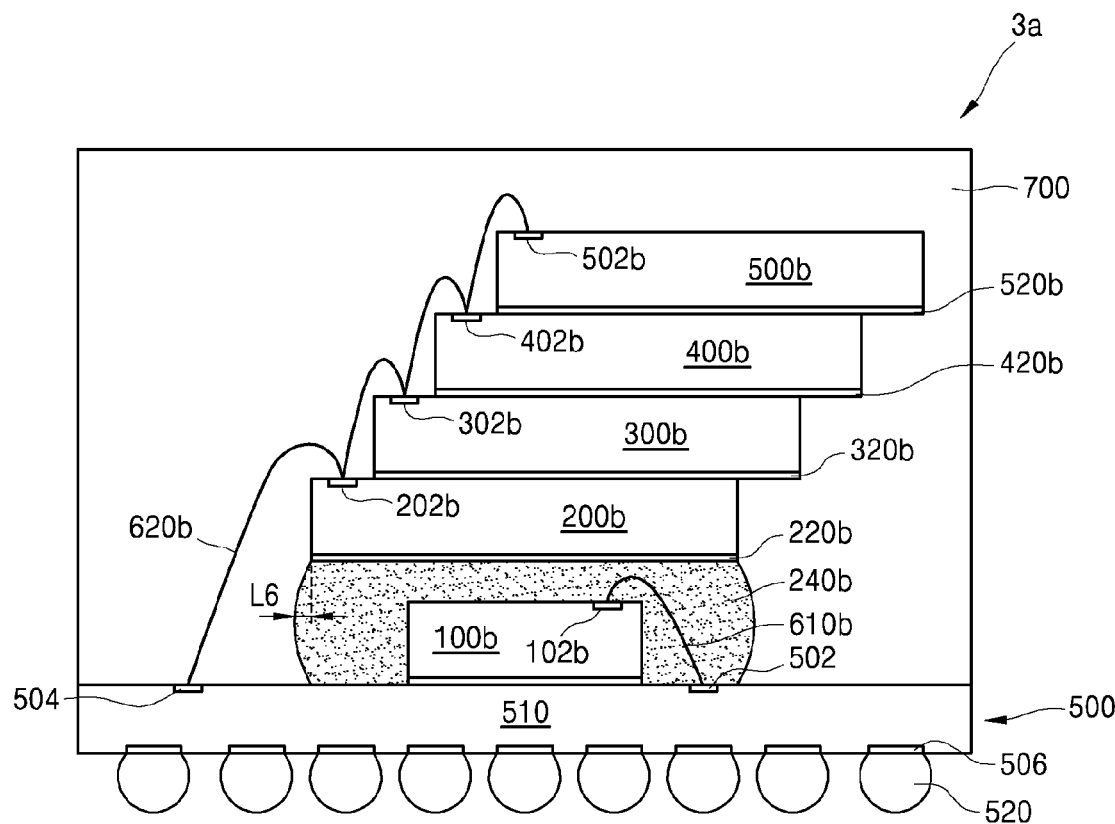
FIGS. 25 to 28 are cross-sectional views illustrating other aspects of a semiconductor package according to an embodiment of the inventive concept.

FIG. 25 is a cross-sectional view illustrating another aspect of a semiconductor package 3a according to a modification of an embodiment of the inventive concept. A description of an overlap with the semiconductor package 3 illustrated in FIGS. 23 and 24 is not repeated.

Referring to FIG. 25, unlike the semiconductor package 3 of FIG. 24, the semiconductor package 3a may include a lower chip 100b and a plurality of upper chips 200b, 300b, 400b and 500b stacked on the lower chip 100b. The upper chips 200b, 300b, 400b and 500b may be sequentially stacked on the lower chip 100b such that they are shifted by a predetermined distance in a horizontal direction of the package base substrate 500 to expose a portion of the top surface of the lower chip. The second bonding wire 620b may connect the upper pads 202b, 302b, 402b and 502b of the upper chips 200b, 300b, 400b and 500b to the second top pad 504 of the package base substrate 500.

The upper chips 300b, 400b and 500b stacked on the lowermost upper chip 200b among the upper chips 200b, 300b, 400b and 500b may be attached respectively onto the upper chips 200b, 300b and 400b by a DAF including first attaching layers 320b, 420b and 520b, respectively.

Figure 26:
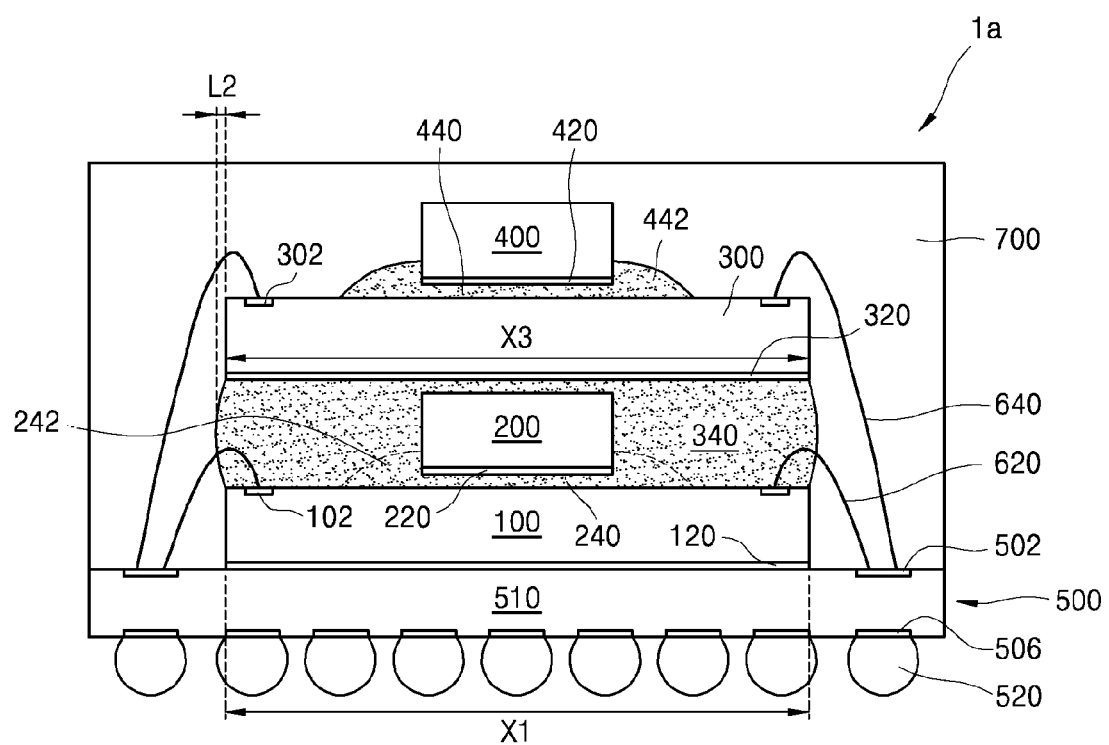
Figure 27:
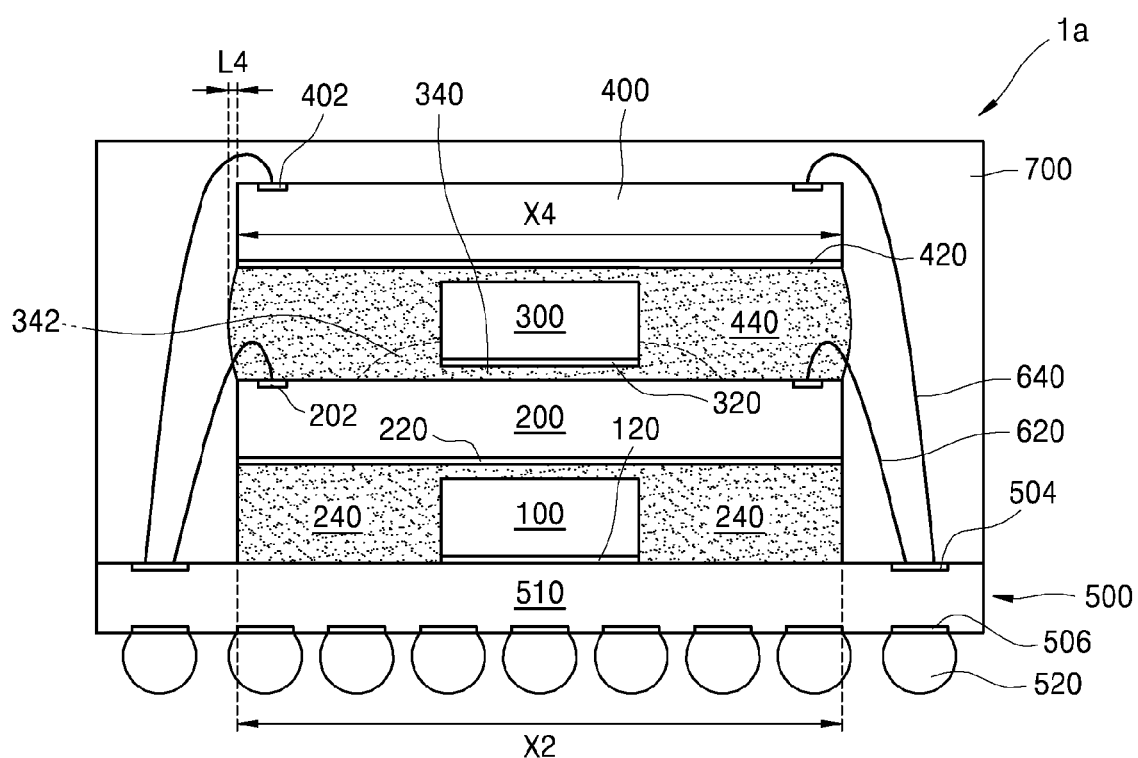

FIGS. 26 and 27 are cross-sectional views illustrating an aspect of a semiconductor package 1a according to an embodiment of the inventive concept. Specifically, FIGS. 26 and 27 are different from FIGS. 18 and 19 in terms of the shapes of second to fourth DAFs 220/240, 320/340 and 420/440, and a redundant description is omitted herein.

Referring to FIGS. 26 and 27, the semiconductor package 1a includes a package base substrate 500 and first to fourth semiconductor chips 100, 200, 300 and 400. A molding member 700 covering the first to fourth semiconductor chips 100, 200, 300 and 400 may be formed on the package base substrate 500. The molding member 700 may cover the first to fourth semiconductor chips 100, 200, 300 and 400, first to fourth bonding wires 610, 620, 630 and 640, and first to fourth DAFs 120, 220/240, 320/340 and 420/440.

The first attaching layer 220/320/420 of the second/third/fourth DAF 220/240/320/340/420/440, respectively, may not contact the top surface of the lower layer, that is, the first/second/third semiconductor chip 100/200/300, respectively.

A portion of the second attaching layer 240 of the second DAFs 220 and 240 may be left between the first semiconductor chip 100 and the first attaching layer 220 of the second DAFs 220 and 240. A portion of the second attaching layer 340 of the third DAFs 320 and 340 may be left between the second semiconductor chip 200 and the first attaching layer 320 of the third DAFs 320 and 340. A portion of the second attaching layer 240 of the fourth DAFs 420 and 440 may be left between the third semiconductor chip 300 and the first attaching layer 420 of the fourth DAFs 420 and 440.

That is, in a process of manufacturing the semiconductor package 1a, when the second semiconductor chip 200 is attached onto the first semiconductor chip 100, pressure applied to the second semiconductor chip 200 may be controlled such that a portion of the second attaching layer 240 of the second DAFs 220 and 240 is left between the first semiconductor chip 100 and the first attaching layer 220 of the second DAFs 220 and 240.

Likewise, when the third semiconductor chip 300 is attached onto the second semiconductor chip 200, pressure applied to the third semiconductor chip 300 may be controlled such that a portion of the second attaching layer 340 of the third DAFs 320 and 340 is left between the second semiconductor chip 200 and the first attaching layer 320 of the third DAFs 320 and 340. Also, when the fourth semiconductor chip 400 is attached onto the third semiconductor chip 300, pressure applied to the fourth semiconductor chip 400 may be controlled such that a portion of the second attaching layer 440 of the fourth DAFs 420 and 440 is left between the third semiconductor chip 300 and the first attaching layer 420 of the fourth DAFs 420 and 440.

Although not illustrated, a semiconductor package may be formed in the shape of a combination of FIGS. 18 and 19 and FIGS. 26 and 27. For example, a semiconductor package may be formed such that some of the first attaching layers 220, 320 and 420 of the second to fourth DAFs 220/240, 320/340 and 420/440, respectively, may not contact the top surface of the lower layer and the other may contact the top surface of the lower chip.

Figure 28:
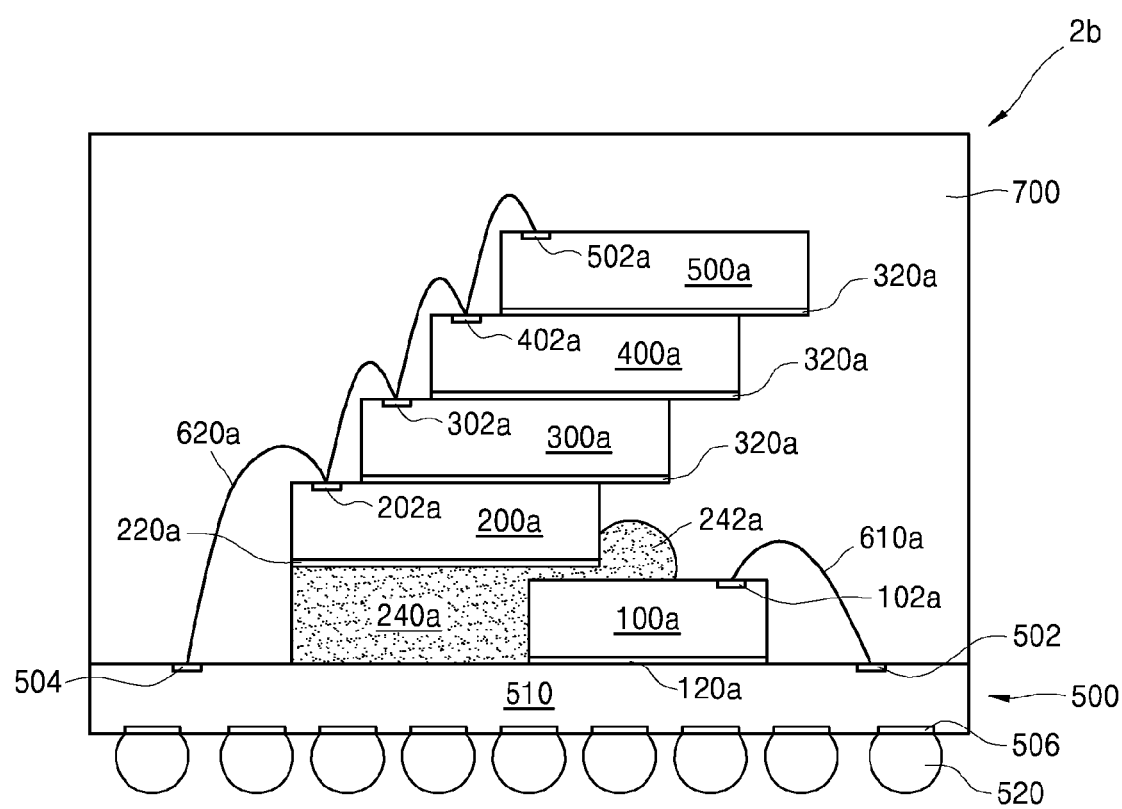

FIG. 28 is a cross-sectional view illustrating another aspect of a semiconductor package 2b according to an embodiment of the inventive concept. Specifically, FIG. 28 is different from FIG. 22 in terms of the shapes of second DAFs 220a and 240a, and a redundant description is omitted herein.

Referring to FIG. 28, the first attaching layer 220a of the second DAFs 220a and 240a included in the semiconductor package 2b may not contact the top surface of the lower chip 100a. That is, a portion of the second attaching layer 240a of the second DAFs 220a and 240a may be left between the lower chip 100a and the upper chip 200a among the upper chips 200a, 200a, 400a and 500a.

FIG. 28 illustrates that a plurality of upper chips 200a, 300a, 400a and 500a are stacked. However, embodiments of the inventive concept are not limited thereto, and one upper layer 200a may be attached onto the lower chip 100a to form a semiconductor package, as illustrated in FIG. 21.

Figure 29:
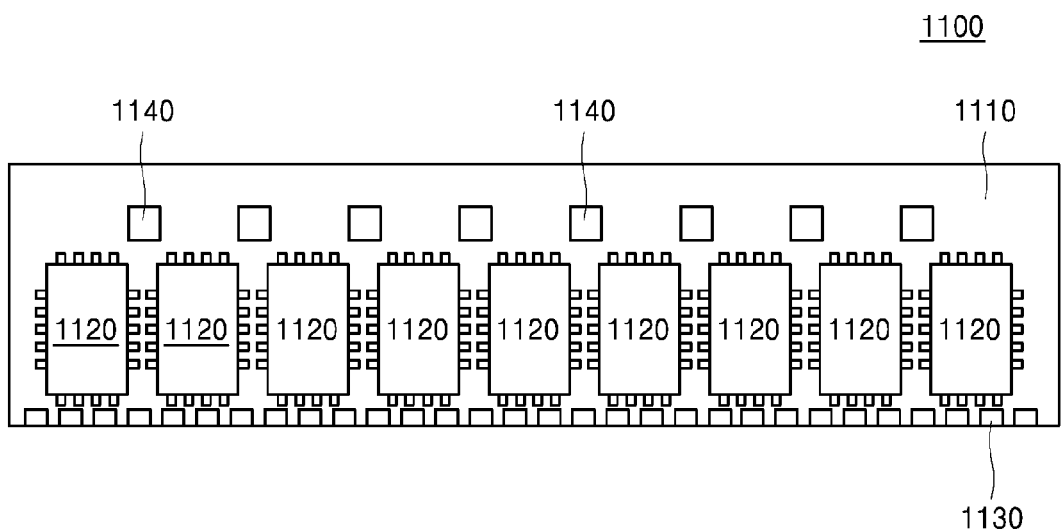
FIG. 29 is a plan view illustrating a memory module including a semiconductor package according to an embodiment of the inventive concept.

FIG. 29 is a plan view illustrating a memory module 1100 including a semiconductor package according to an embodiment of the inventive concept.

Referring to FIG. 29, the memory module 1100 includes a module substrate 1110 and a plurality of semiconductor packages 1120 attached to the module substrate 1110.

The semiconductor package 1120 includes a semiconductor package according to an embodiment of the inventive concept. For example, the semiconductor package 1120 may include the semiconductor packages 1, 1a, 2, 2a, 2b, 3 and 3a illustrated in FIGS. 18 to 28.

A connection portion 1130 that may be inserted into a socket of a motherboard is disposed at one side of the module substrate 1110. A ceramic decoupling capacitor 1140 is disposed on the module substrate 1110. The memory module 1100 according to the inventive concept is not limited to the configuration illustrated in FIG. 29, and may be manufactured in various forms.

Figure 30:
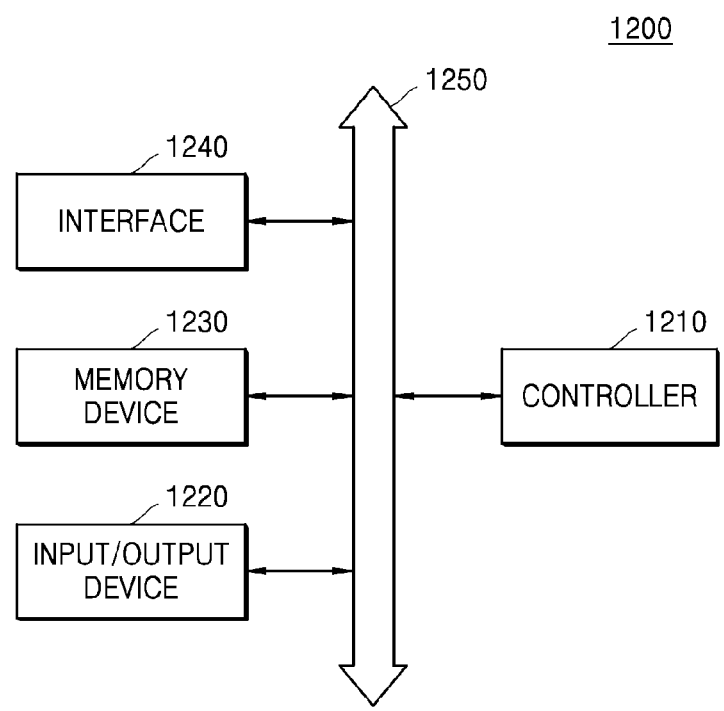
FIG. 30 is a block diagram illustrating a system including a semiconductor package according to an embodiment of the inventive concept.

FIG. 30 is a block diagram illustrating a system 1200 including a semiconductor package according to an embodiment of the inventive concept.

Referring to FIG. 30, the system 1200 includes a controller 1210, an input/output device 1220, a memory device 1230, and an interface 1240. The system 1200 may be a mobile system or a system that transmits or receives information. In some embodiments, the mobile system is a PDA, a portable computer, a web tablet, a wireless phone, a mobile phone, a digital music player, or a memory card. The controller 1210 controls an execution program in the system 1200. The controller 1210 may include a microprocessor, a digital signal processor, a microcontroller, or the like. The input/output device 1220 may be used to input or output data of the system 1200. By using the input/output device 1220, the system 1200 may be connected to an external device, for example, a personal computer or a network to exchange data with the external device. The input/output device 1220 may be, for example, a keypad, a keyboard, or a display device.

The memory device 1230 may store codes and/or data for operation of the controller 1210, or store data processed by the controller 1210. The memory device 1230 includes a semiconductor package according to an embodiment of the inventive concept. For example, the memory device 1230 may include the semiconductor packages 1, 1a, 2, 2a, 2b, 3 and 3a illustrated in FIGS. 18 to 28.

The interface 1240 may be a data transmission path between the system 1200 and other external devices. The controller 1210, the input/output device 1220, the memory device 1230, and the interface 1240 may communicate with each other through a bus 1250. The system 1200 may be used in mobile phones, MP3 players, navigation devices, portable multimedia players (PMPs), solid state disks (SSDs), or household appliances.

Figure 31:
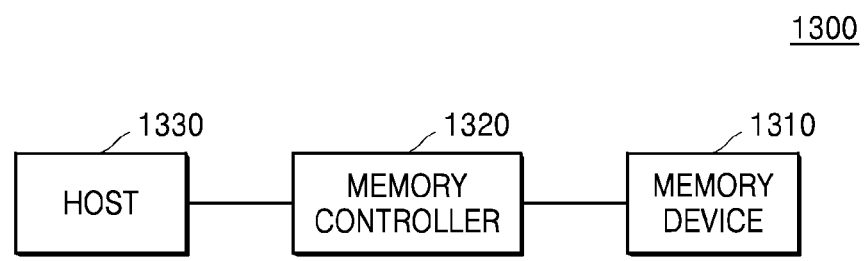
FIG. 31 is a block diagram illustrating a memory card including a semiconductor package according to an embodiment of the inventive concept.

FIG. 31 is a block diagram illustrating a memory card 1300 including a semiconductor package according to an embodiment of the inventive concept.

Referring to FIG. 31, the memory card 1300 includes a memory device 1310 and a memory controller 1320.

The memory device 1310 may store data. In some embodiments, the memory device 1310 has nonvolatile characteristics that may retain stored data even when power supply thereto is interrupted. The memory device 1310 includes a semiconductor package according to an embodiment of the inventive concept. For example, the memory device 1310 may include the semiconductor packages 1, 1a, 2, 2a, 2b, 3 and 3a illustrated in FIGS. 18 to 28.

The memory controller 1320 may read data stored in the memory device 1310 or may store data in the memory device 1310, in response to a read/write request of a host 1330.

While the inventive concept has been particularly shown and described with reference to exemplary embodiments thereof, it will be understood that various changes in form and details may be made therein without departing from the spirit and scope of the following claims.

What is claimed is:

1. A semiconductor package comprising:
a package base substrate;
a lower chip stacked on the package base substrate;
an upper chip stacked on the lower chip; and
a first die attach film (DAF) attached to a bottom surface of the upper chip to cover at least a portion of the lower chip,
wherein the first DAF is a multi-layer film comprising a first attaching layer contacting the bottom surface of the upper chip and a second attaching layer attached to a bottom of the first attaching layer to cover at least a portion of a side surface of the lower chip,
wherein the second attaching layer comprises a protrusion portion protruding out of a range occupied by the upper chip, in a space between a level of the bottom surface of the upper chip and a level of a top surface of the package base substrate.

2. The semiconductor package of claim 1, wherein:
each of the first attaching layer and the second attaching layer comprises a binder component, and
a weight-average molecular weight of the binder component of the first attaching layer is larger than a weight-average molecular weight of the binder component of the second attaching layer.

3. The semiconductor package of claim 2, wherein:
the binder component of the first attaching layer comprises a first binder material and a second binder material, the second binder material having a smaller weight-average molecular weight than the first binder material, and
the binder component of the second attaching layer comprises the second binder material.

4. The semiconductor package of claim 2, further comprising a second DAF attached to a bottom surface of the lower chip to attach the lower chip onto the package base substrate,
wherein the second DAF is a single film comprising a binder component having a larger weight-average molecular weight than the binder component of the second attaching layer.

5. A semiconductor package comprising:
a package base substrate;
a lower chip stacked on the package base substrate;
an upper chip stacked on the lower chip;
a first die attach film (DAF) attached to a bottom surface of the upper chip to cover at least a portion of the lower chip; and
a bonding wire connecting the package base substrate and a top surface of the lower chip,
wherein the first DAF is a multi-layer film comprising a first attaching layer contacting the bottom surface of the upper chip and a second attaching layer attached to a bottom of the first attaching layer to cover at least a portion of a side surface of the lower chip, and
wherein the second attaching layer covers at least a portion of the bonding wire.

6. The semiconductor package of claim 1, wherein the first attaching layer of the first DAF contacts a top surface of the lower chip.

7. The semiconductor package of claim 1, wherein the protrusion portion of the second attaching layer covers at least a portion of a top surface of the lower chip.

8. The semiconductor package of claim 1, wherein the protrusion portion of the second attaching layer extends from one side surface of the lower chip through the top surface of the lower chip to the other side surface of the lower chip.

9. A semiconductor package comprising:
a package base substrate;
first to fourth semiconductor chips stacked sequentially on the package base substrate with major axes thereof intersecting with each other; and
first to fourth die attach films (DAFs) attached respectively to bottom surfaces of the first to fourth semiconductor chips,
wherein each of the second, third, and fourth DAF comprises a first attaching layer contacting the bottom surface of the second, third, and fourth semiconductor chips, respectively, and a second attaching layer attached to a bottom of the first attaching layer to cover at least a portion of a side surface of the first, second, and third semiconductor chips, respectively.

10. The semiconductor package of claim 9, wherein:
the first DAF includes a binder resin,
the first and second attaching layers of the second, third, and fourth DAF each include a binder resin,
a weight-average molecular weight of the binder resin of the first DAF is larger than a weight-average molecular weight of the binder resin of the second attaching layer of the second, third, and fourth DAF, and
a weight-average molecular weight of the binder resin of the first attaching layer of the second, third, and fourth DAF is larger than a weight-average molecular weight of the binder resin of the second attaching layer of the second, third, and fourth DAF.

11. The semiconductor package of claim 9, wherein the second attaching layer of the fourth DAF covers at least a portion of a top surface of the third semiconductor chip that is adjacent to a boundary between the third semiconductor chip and the fourth semiconductor chip.

12. The semiconductor package of claim 11, wherein the second attaching layer of the fourth DAF exposes at least a portion of the top surface of the third semiconductor chip.

13. The semiconductor package of claim 9, wherein:
the second attaching layer of the second DAF comprises a first protrusion portion protruding out of a range occupied by the second semiconductor chip, in a space between a level of the bottom surface of the second semiconductor chip and a level of a top surface of the package base substrate,
the second attaching layer of the third DAF comprises a second protrusion portion protruding out of a range occupied by the third semiconductor chip, in a space between a level of the bottom surface of the third semiconductor chip and a level of a top surface of the first semiconductor chip, and
the second attaching layer of the fourth DAF comprises a third protrusion portion protruding out of a range occupied by the fourth semiconductor chip, in a space between a level of the bottom surface of the fourth semiconductor chip and a level of a top surface of the second semiconductor chip.

14. The semiconductor package of claim 13, wherein a length of the first protrusion portion protruding in a direction of the major axis of the first semiconductor chip is smaller than a length of the third protrusion portion protruding in a direction of the major axis of the third semiconductor chip.

* * * * *